US012727469B2

(12) United States Patent
Terada et al.

(10) Patent No.: US 12,727,469 B2
(45) Date of Patent: Sep. 1, 2026

(54) SEMICONDUCTOR DEVICE

(71) Applicants: Sony Semiconductor Solutions Corporation, Kanagawa (JP); TAIWAN SEMICONDUCTOR MANUFACTURING CO LTD, Hsinch (TW)

(72) Inventors: Haruhiko Terada, Kanagawa (JP); Tseng Kuo-Chyuan, Hsinch (TW)

(73) Assignees: Sony Semiconductor Solutions Corporation, Kanagawa (JP); Taiwan Semiconductor Manufacturing Co Ltd, Hsinch (TW)

( * ) Notice: Subject to any disclaimer, the term of this patent is extended or adjusted under 35 U.S.C. 154(b) by 382 days.

(21) Appl. No.: 18/245,746

(22) PCT Filed: Oct. 19, 2021

(86) PCT No.: PCT/JP2021/038566
§ 371 (c)(1),
(2) Date: Mar. 17, 2023

(87) PCT Pub. No.: WO2022/102353
PCT Pub. Date: May 19, 2022

(65) Prior Publication Data

US 2023/0361035 A1 Nov. 9, 2023

(30) Foreign Application Priority Data

Nov. 10, 2020 (JP) ................................ 2020-187190

(51) Int. Cl.

| | |
|---|---|
| ***H01L 23/528*** | (2006.01) |
| ***H01L 23/522*** | (2006.01) |
| ***H10B 63/00*** | (2023.01) |

(52) U.S. Cl.
CPC ...... *H01L 23/5283* (2013.01); *H01L 23/5226* (2013.01); *H10B 63/20* (2023.02)

(58) Field of Classification Search
CPC .. H01L 23/5283; H01L 23/5226; H10B 63/20
(Continued)

(56) References Cited

U.S. PATENT DOCUMENTS

| | | | |
|---|---|---|---|
| 10,403,681 | B2 | 9/2019 | Ahn et al. |
| 10,748,965 | B2 | 8/2020 | Mliyazaki |

(Continued)

FOREIGN PATENT DOCUMENTS

| | | |
|---|---|---|
| JP | 2011508459 A | 3/2011 |
| JP | 2011114011 A | 6/2011 |

(Continued)

OTHER PUBLICATIONS

PCT/JP2021/038566 International Search Report and Written Opinion dated Dec. 28, 2021.

(Continued)

*Primary Examiner* — Tu-Tu V Ho
(74) *Attorney, Agent, or Firm* — Michael Best & Friedrich LLP

(57) ABSTRACT

A semiconductor device according to an embodiment of the present disclosure includes: a first memory cell layer including a first selection line extending in a first direction, a second selection line extending in a second direction, and a first memory cell coupled to the first selection line and the second selection line; a second memory cell layer provided above the first memory cell layer, and including a third selection line extending in the first direction, a fourth selection line extending in the second direction, and a second memory cell coupled to the third selection line and the fourth selection line; and a first wiring layer provided (Continued)

between the first memory cell layer and the second memory cell layer and including a first metal wiring line.

9 Claims, 17 Drawing Sheets

(58) Field of Classification Search
USPC .......................................................... 257/734
See application file for complete search history.

(56) References Cited

U.S. PATENT DOCUMENTS

| | | | | |
|---|---|---|---|---|
| 2013/0003437 | A1* | 1/2013 | Siau | G11C 13/0069 257/E21.645 |
| 2018/0175108 | A1* | 6/2018 | Terada | G11C 29/80 |
| 2020/0227481 | A1 | 7/2020 | Jeong et al. | |

FOREIGN PATENT DOCUMENTS

| | | | |
|---|---|---|---|
| JP | 2017005097 | A | 1/2017 |
| JP | 2018200967 | A | 12/2018 |
| WO | 2009075073 | A1 | 6/2009 |

OTHER PUBLICATIONS

Taiwanese Office Action issued Jul. 16, 2025 for corresponding Taiwanese Application No. 110140993.

* cited by examiner

[ FIG. 1 ]
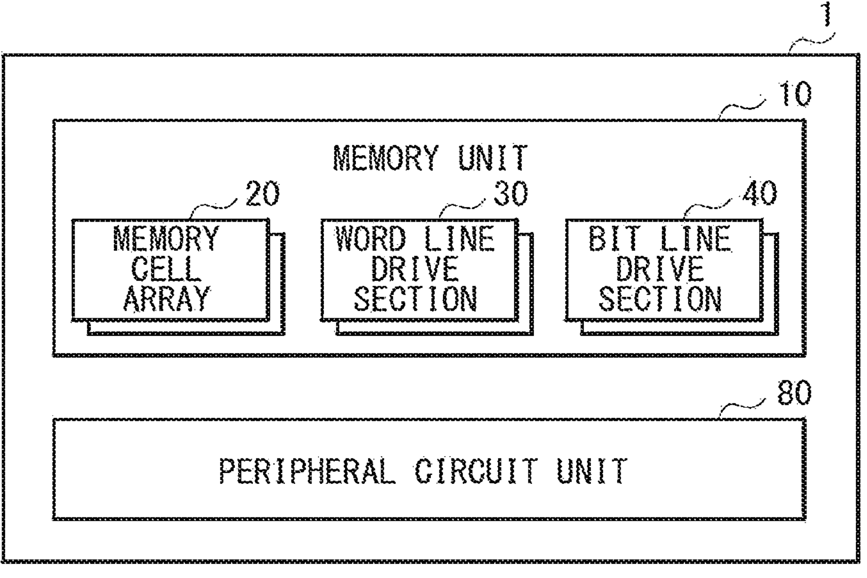

[ FIG. 2 ]
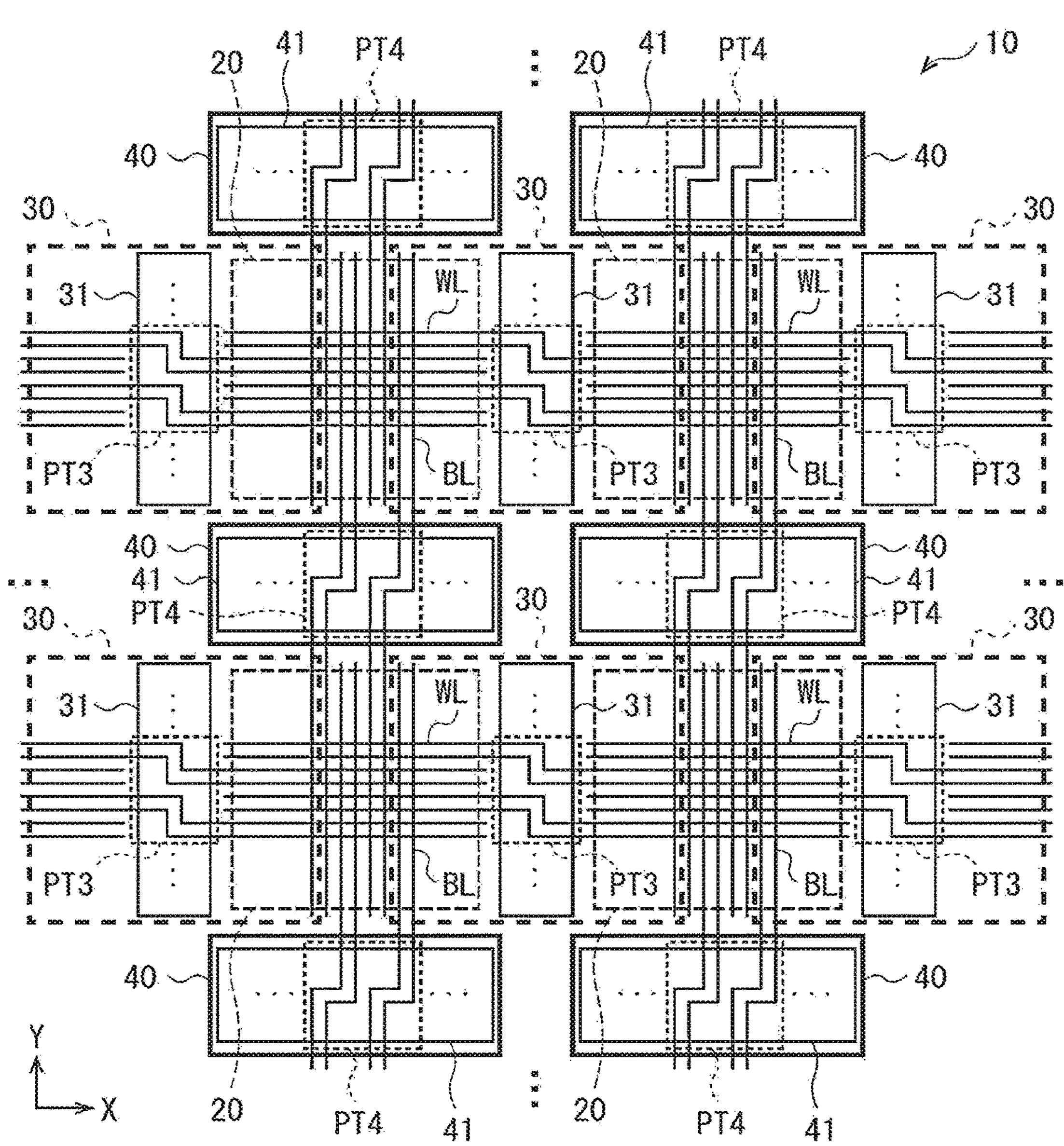

[ FIG. 3 ]
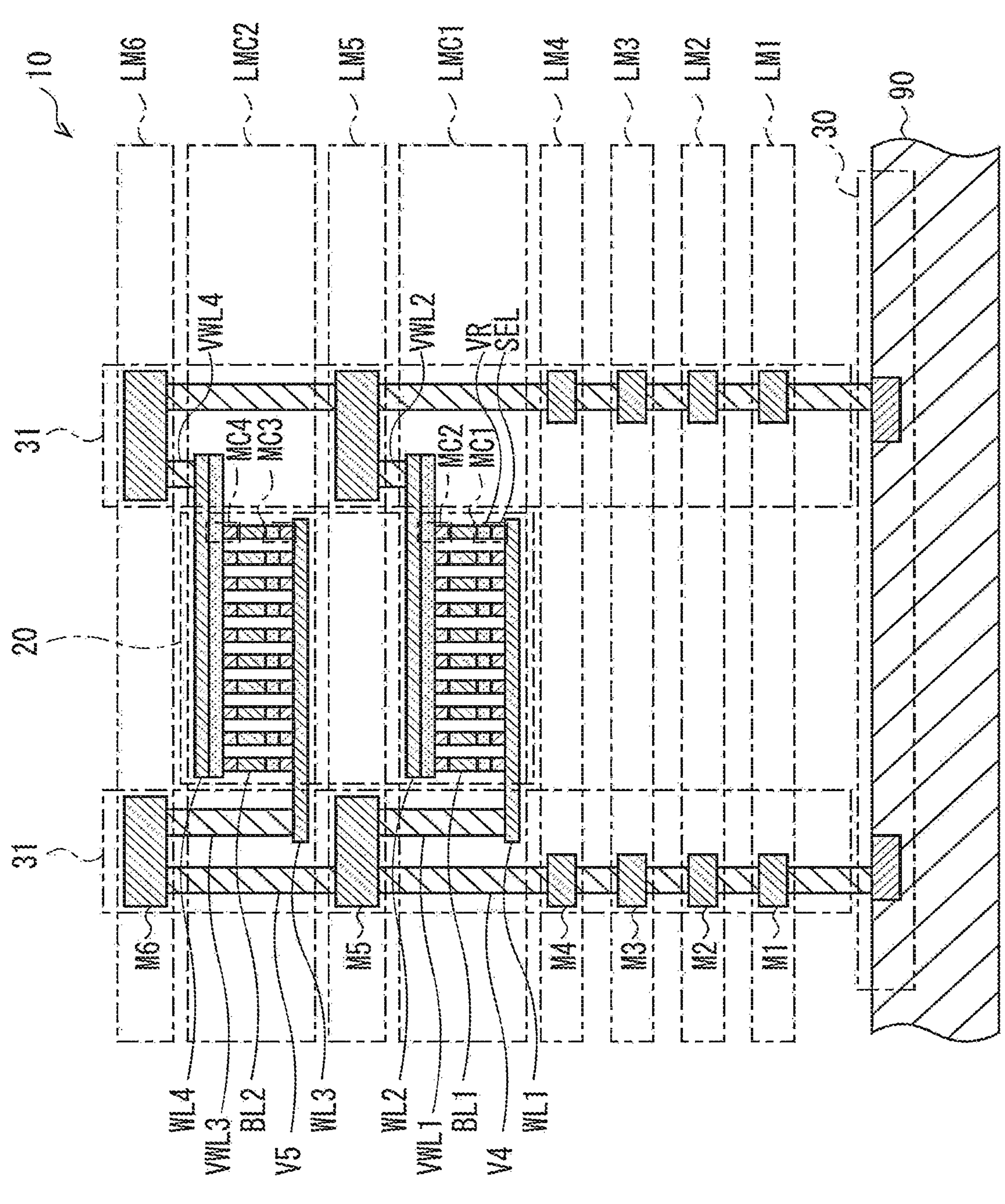

[ FIG. 4 ]
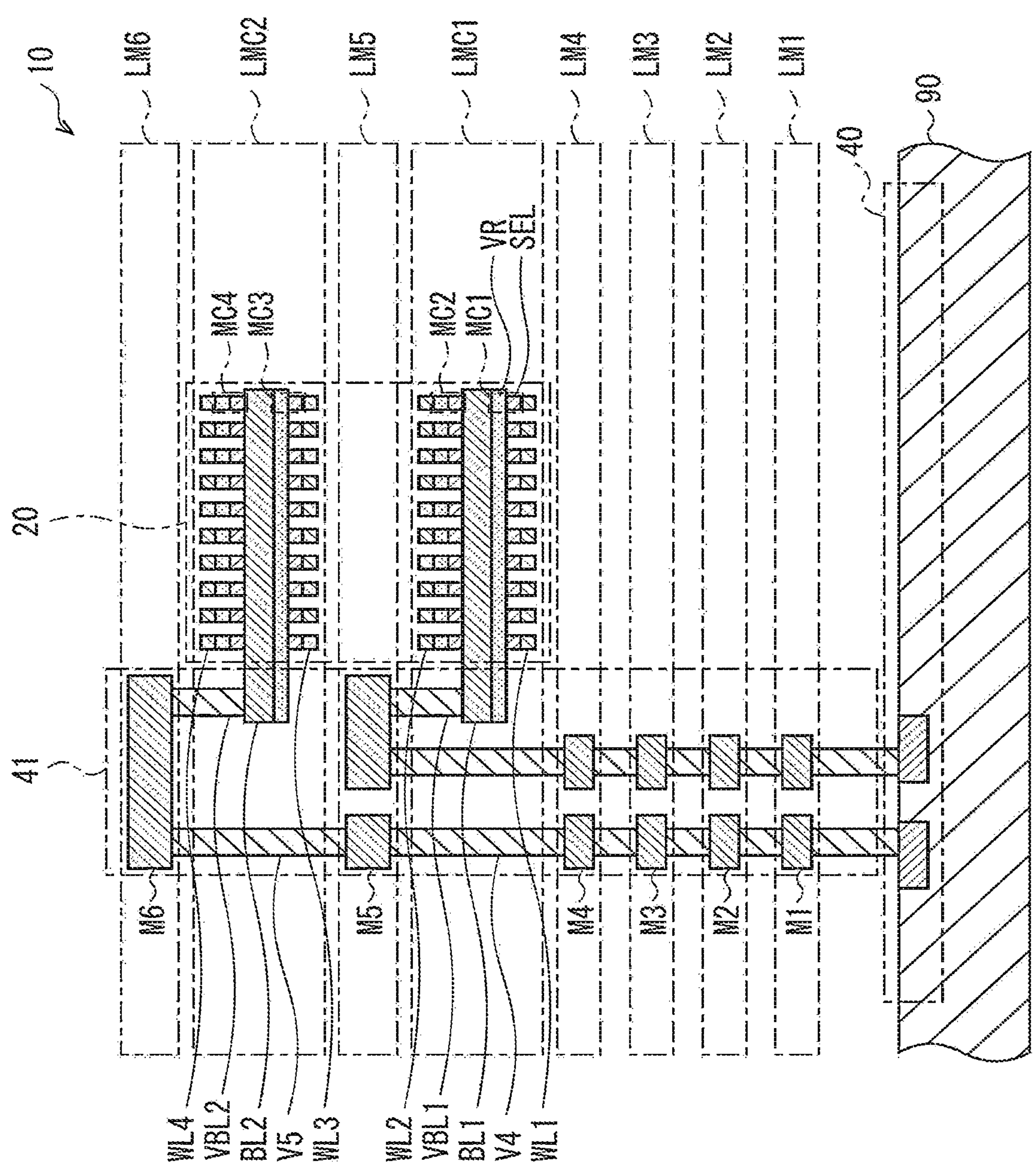

[ FIG. 5 ]
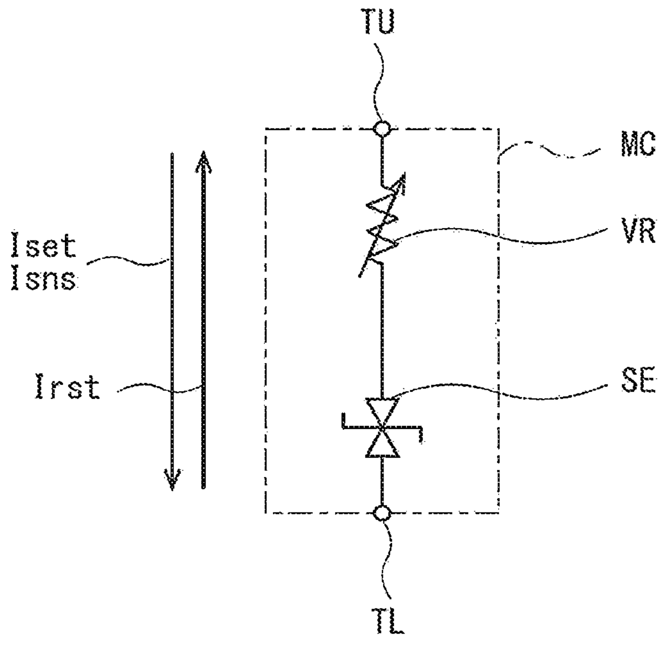
[ FIG. 6 ]
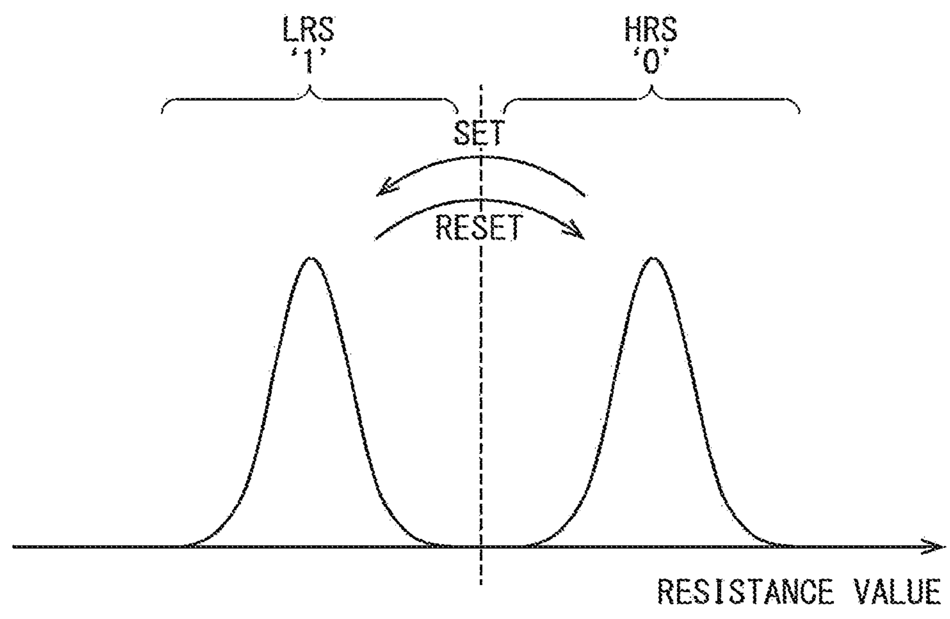

[ FIG. 7 ]
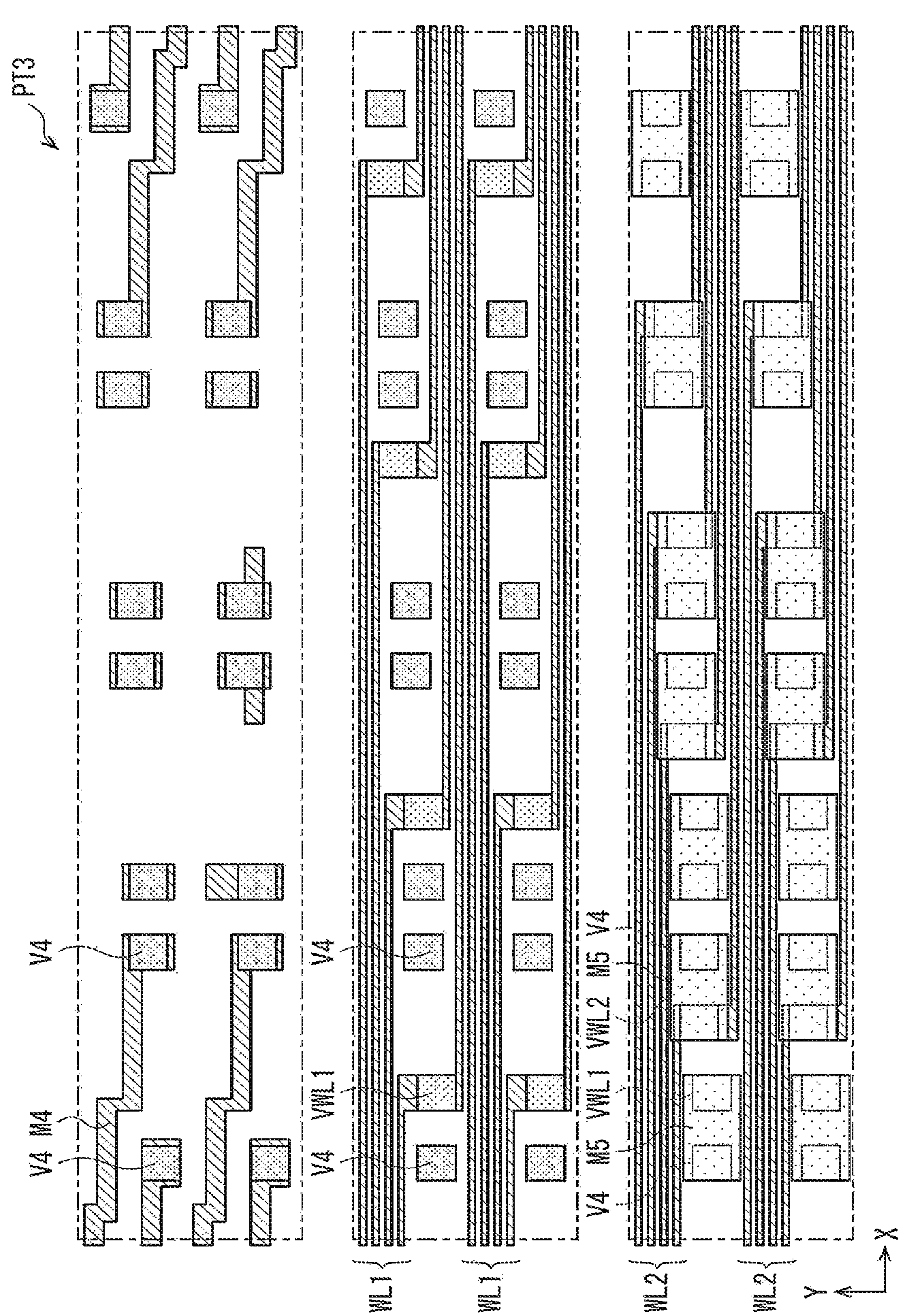

[ FIG. 8 ]
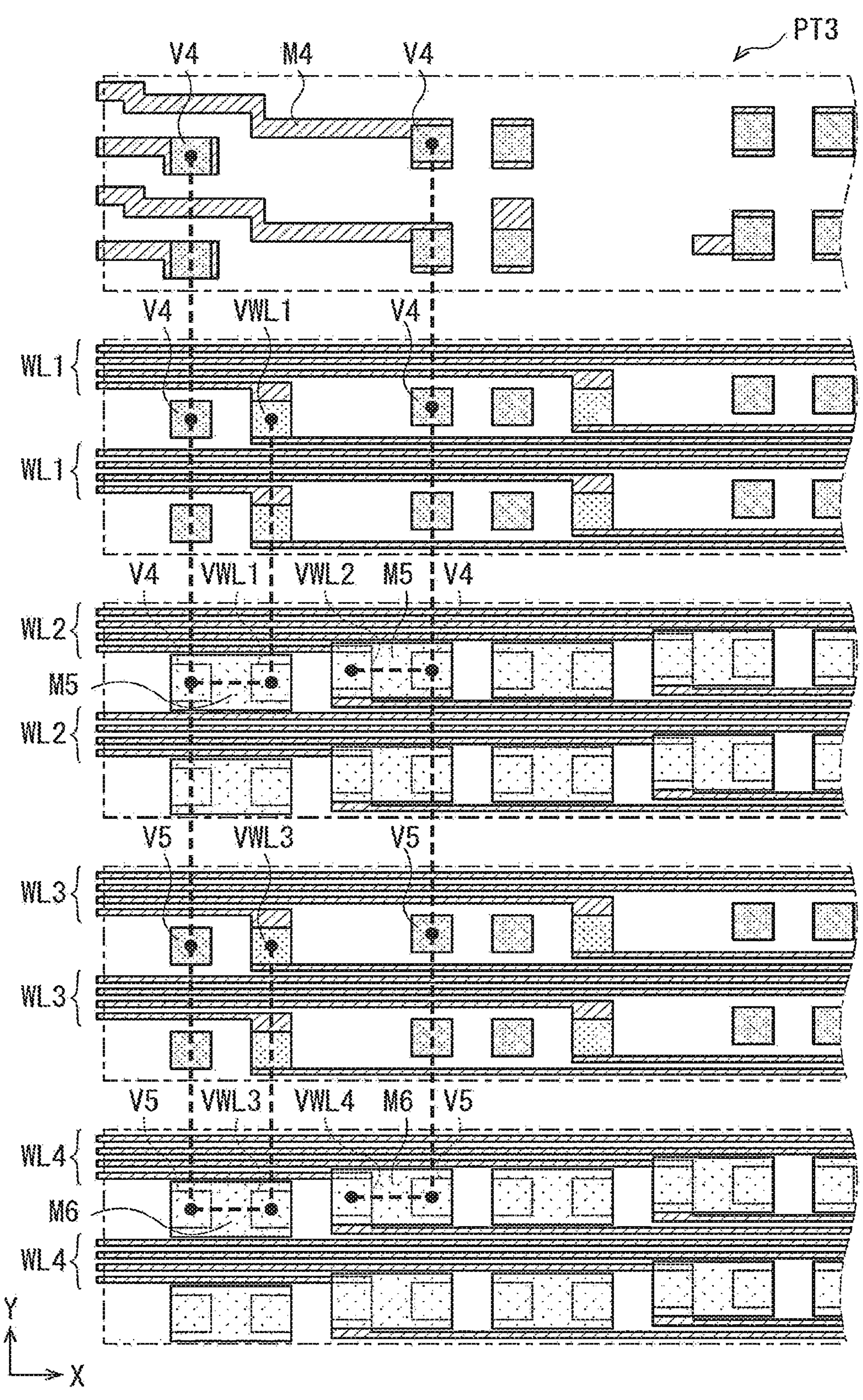

[ FIG. 9 ]
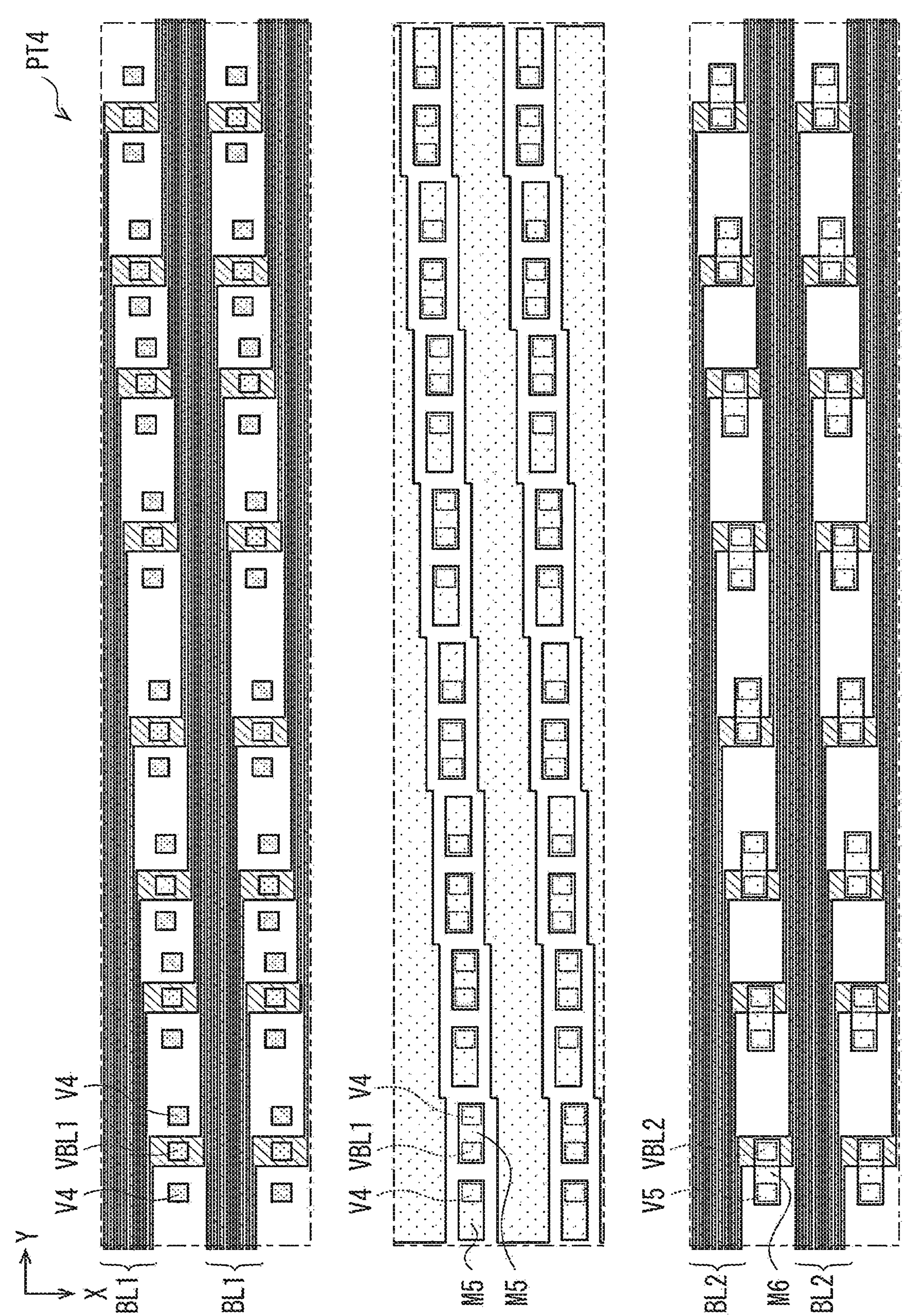

[ FIG. 10 ]
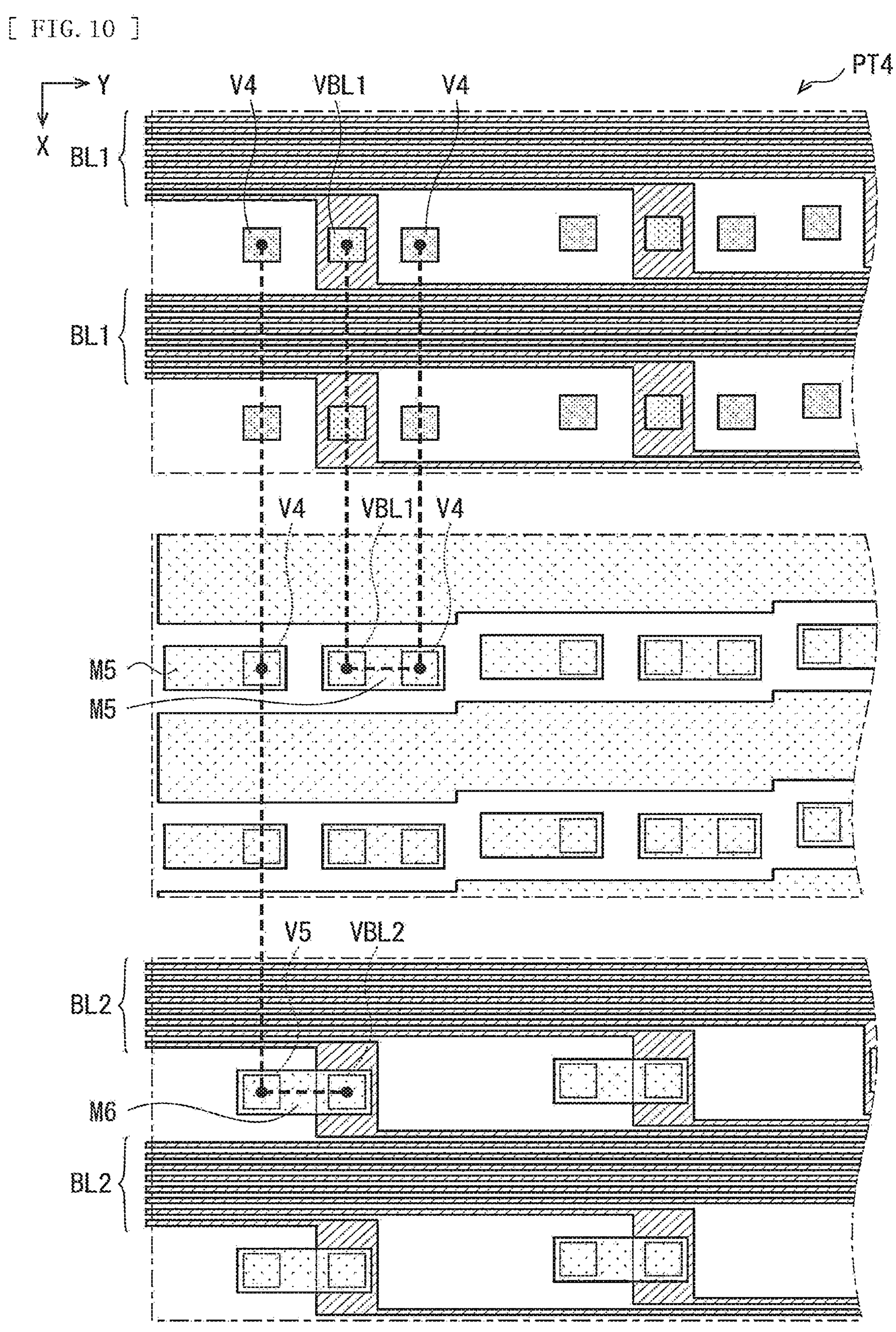

[ FIG. 11 ]
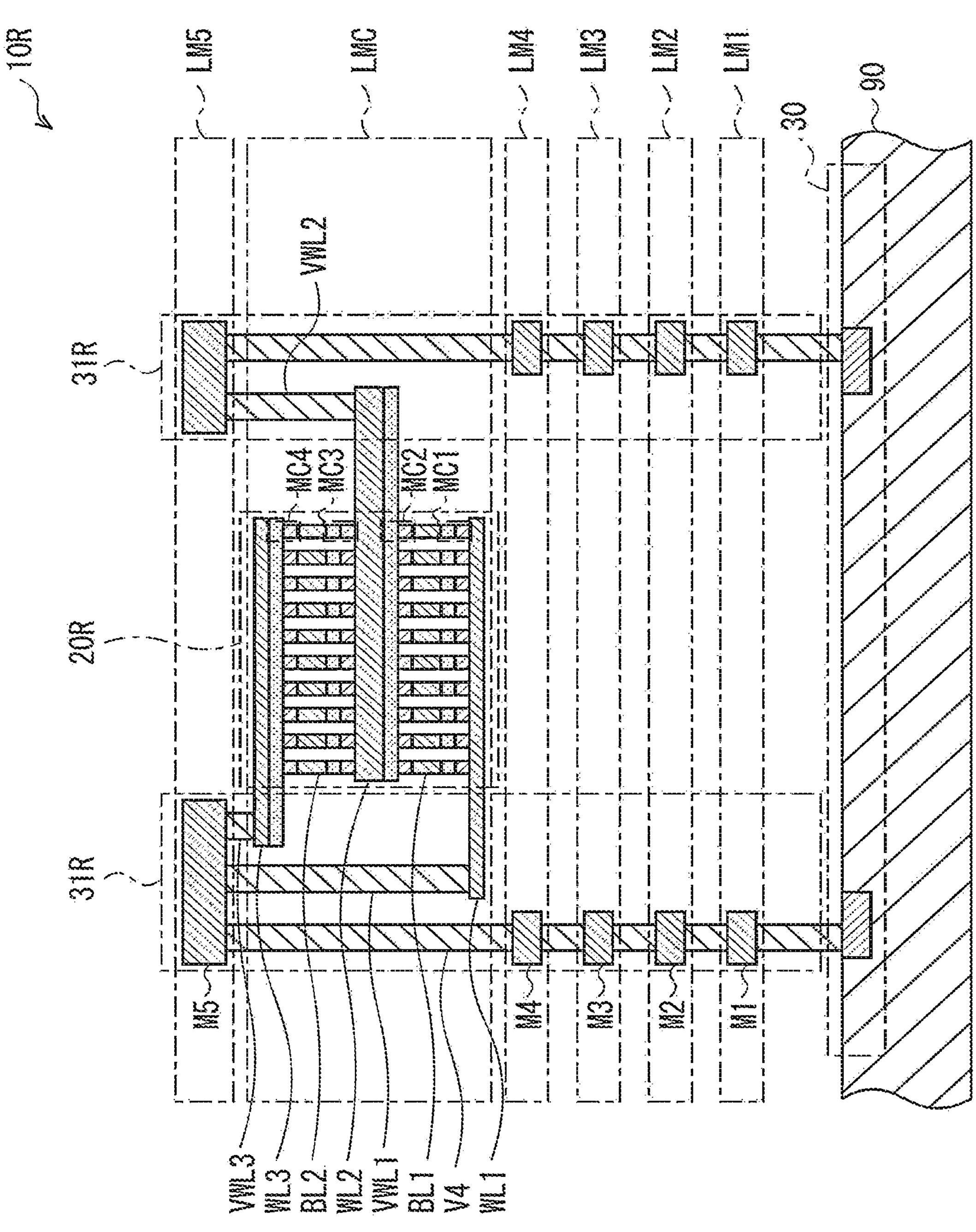

[ FIG. 12 ]
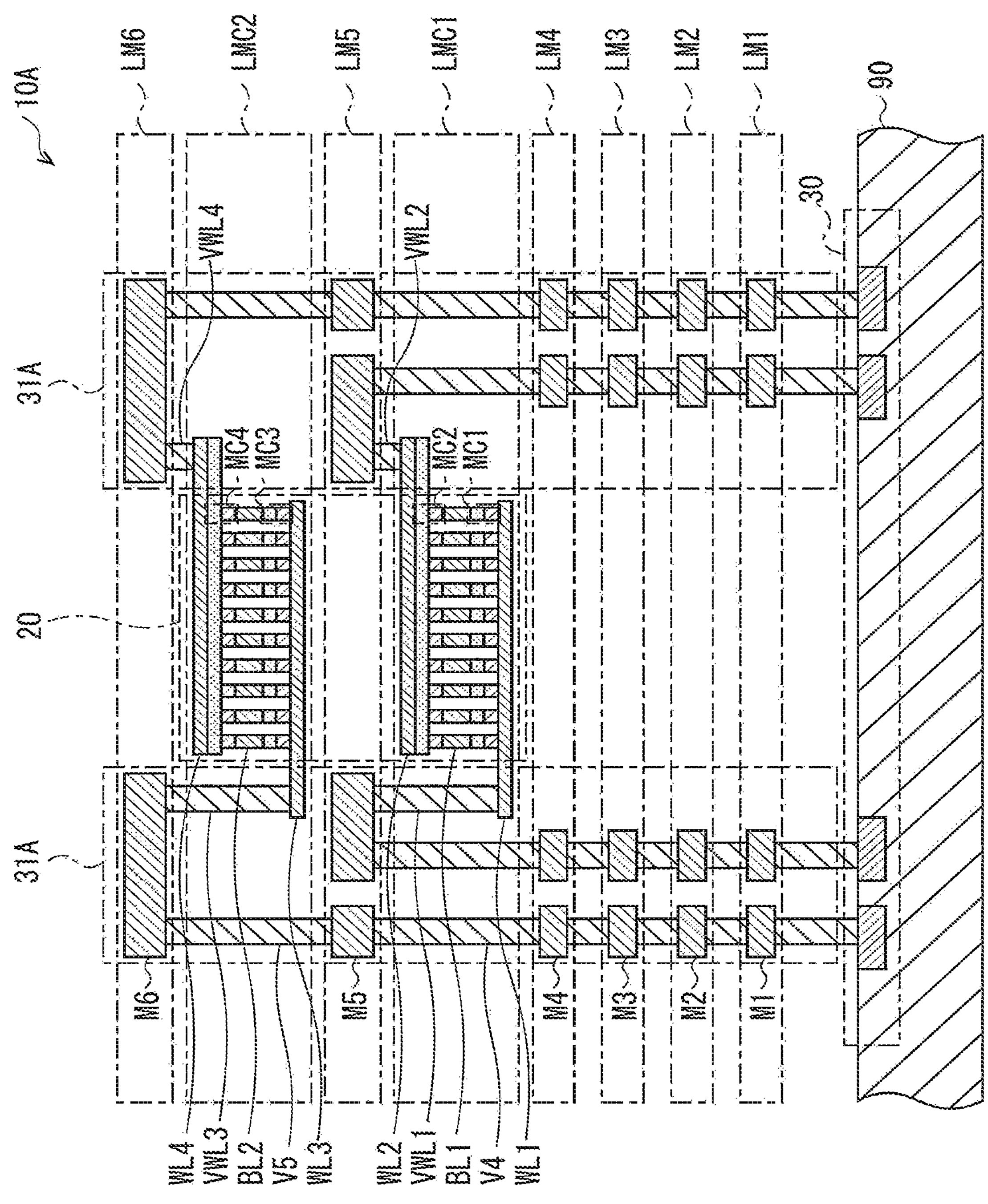

[ FIG. 13 ]
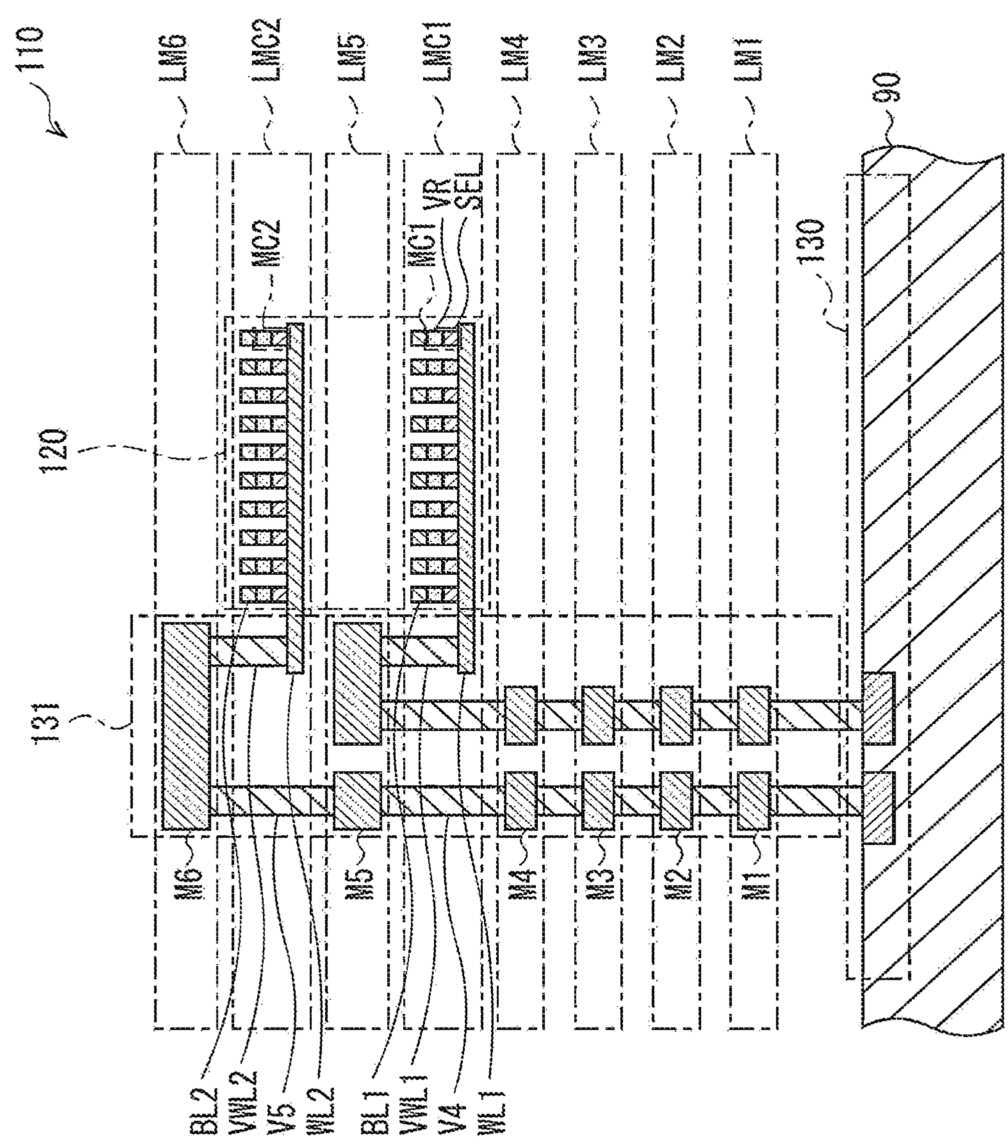

[ FIG. 14 ]
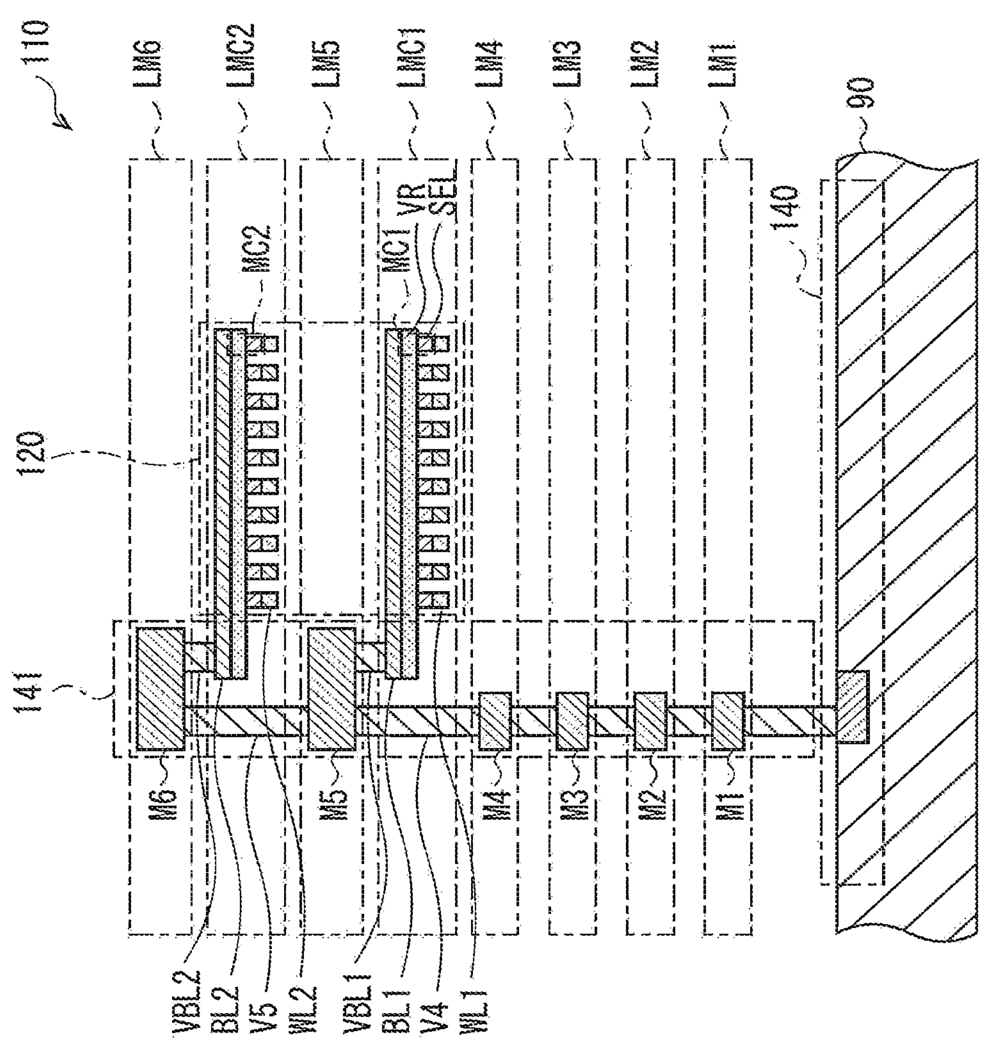

[ FIG. 15 ]
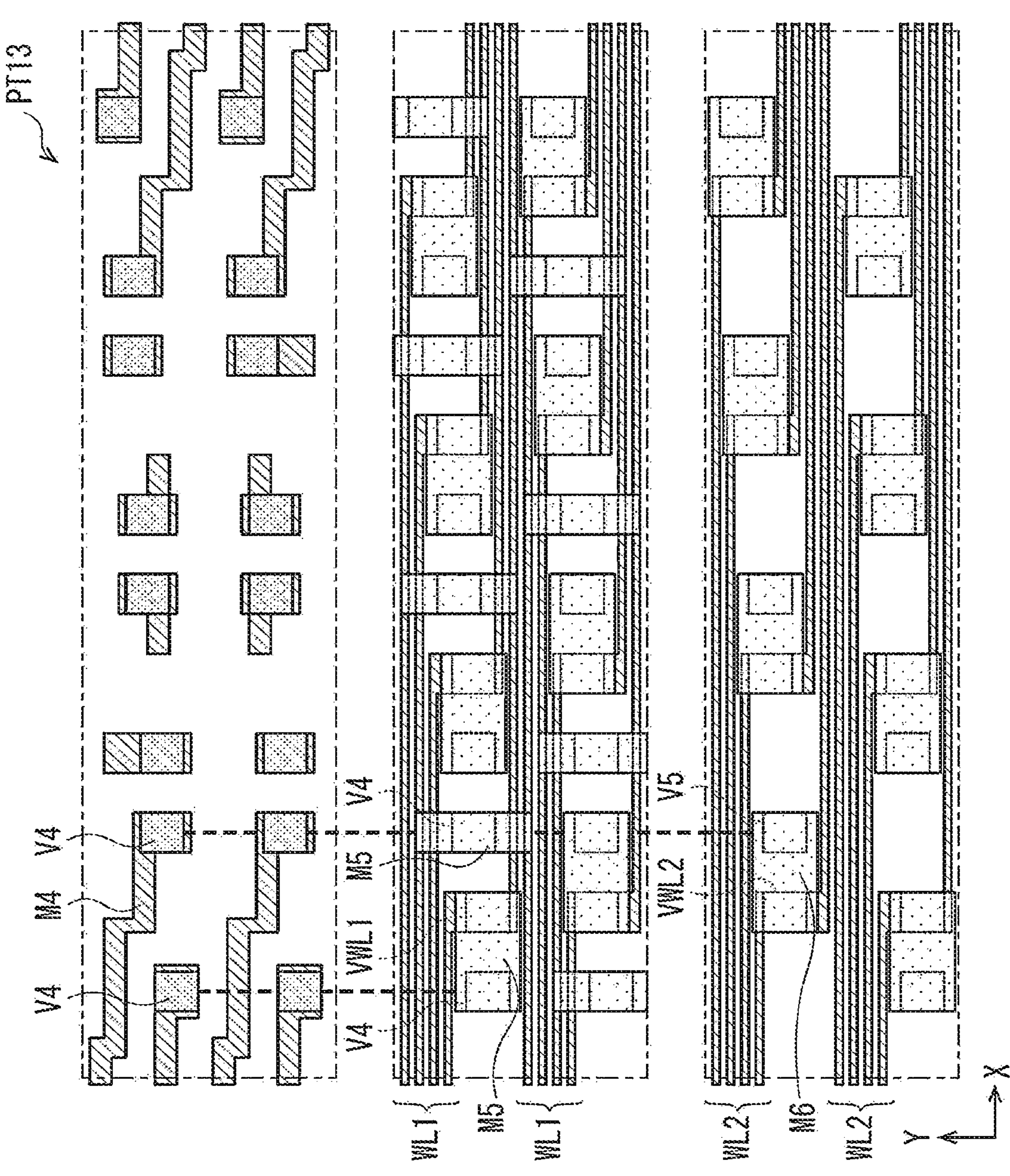

[ FIG. 16 ]
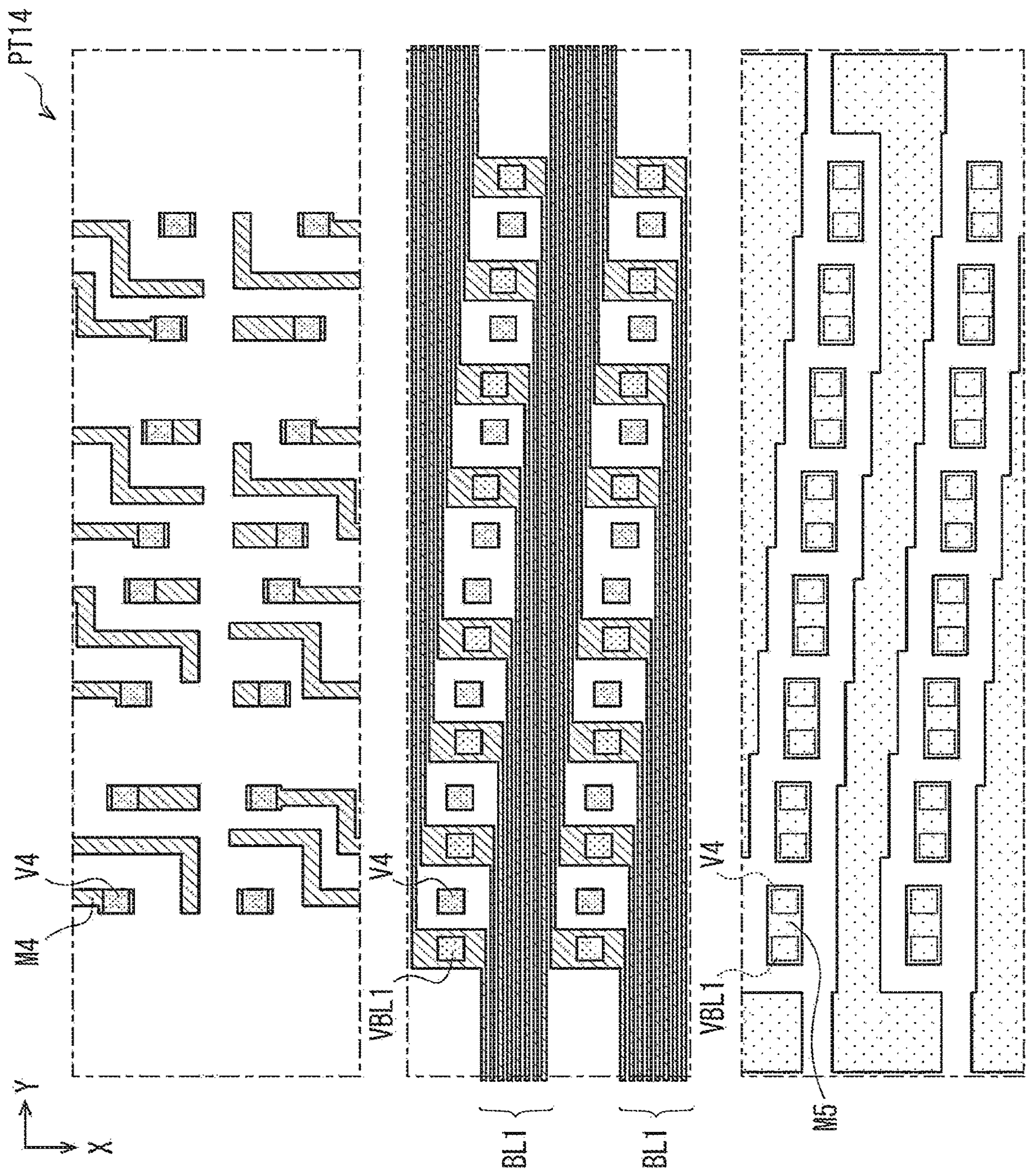

[ FIG. 17 ]
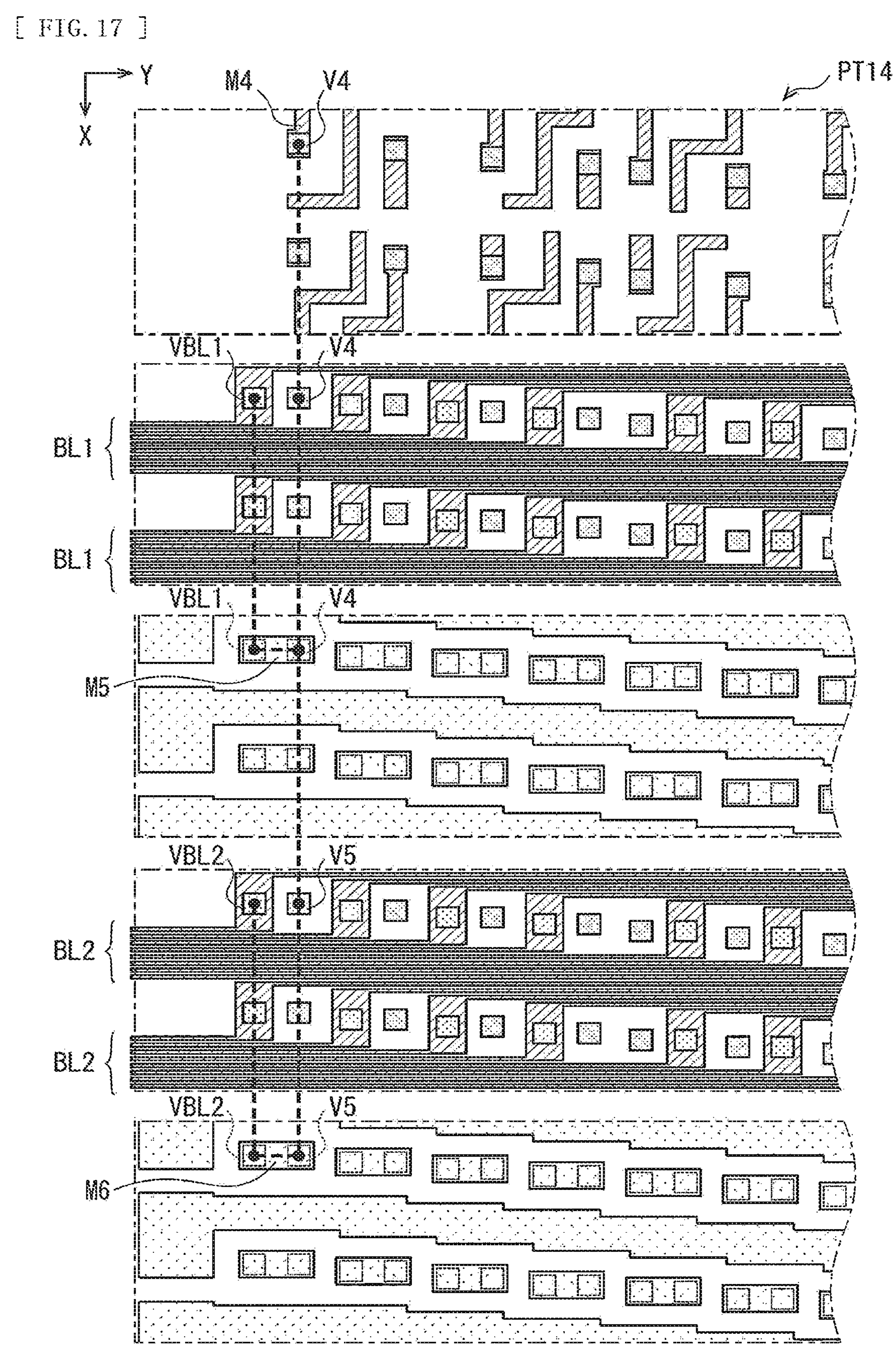

[ FIG. 18 ]
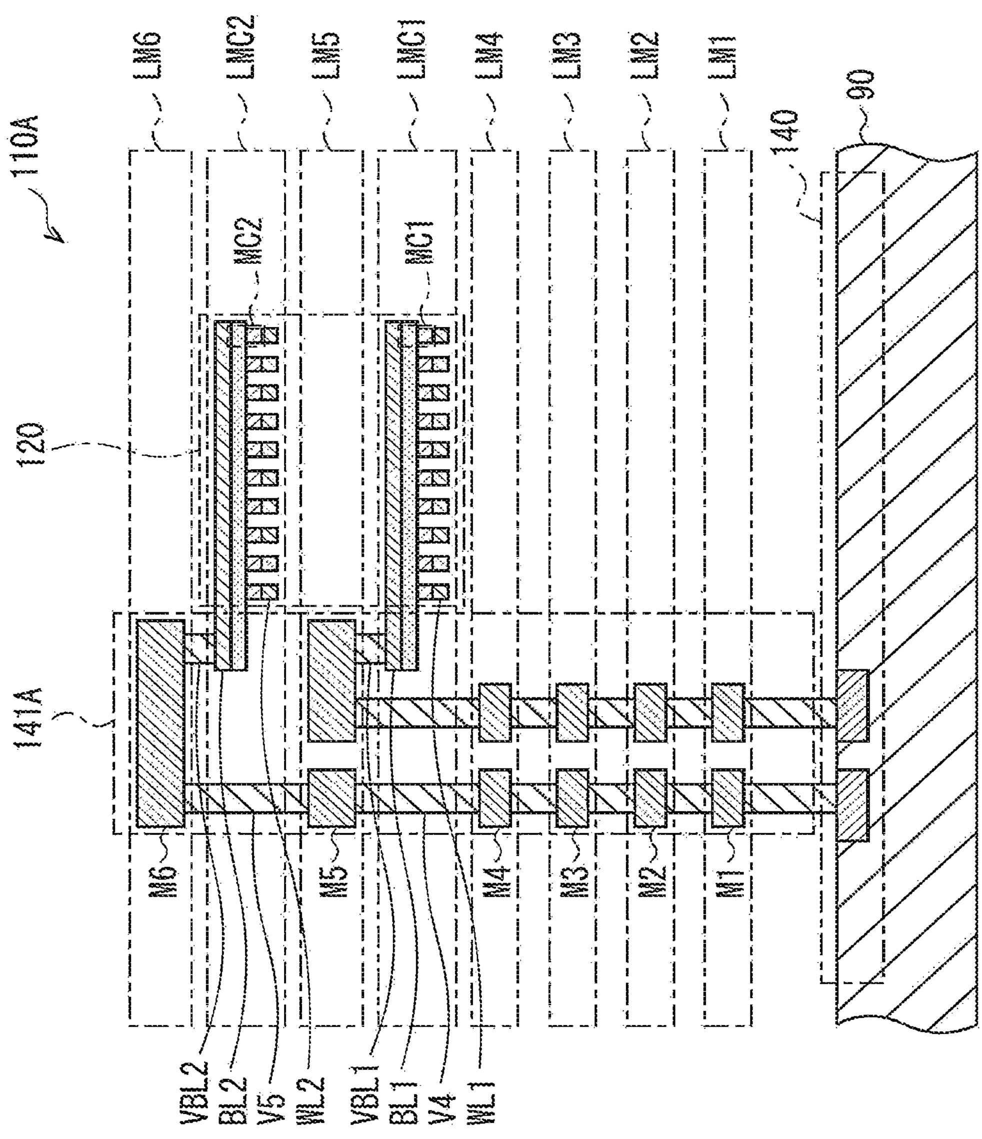

SEMICONDUCTOR DEVICE

TECHNICAL FIELD

The present disclosure relates to a semiconductor device that is able to store information.

BACKGROUND ART

In recent years, for example, much focus has been placed on a non-volatile memory device using a resistive random access memory that allows for performance of faster data access than a flash memory. For example, PTL 1 discloses a memory device including one storage layer or two storage layers.

CITATION LIST

Patent Literature

PTL 1: Japanese Unexamined Patent Application Publication No. 2018-200967

SUMMARY OF THE INVENTION

Incidentally, a semiconductor device is generally desired to be easy to manufacture, and a further improvement is expected in the ease of manufacture.

It is desirable to provide a semiconductor device that is easy to manufacture.

A semiconductor device according to an embodiment of the present disclosure includes a first memory cell layer, a second memory cell layer, and a first wiring layer. The first memory cell layer includes a first selection line extending in a first direction, a second selection line extending in a second direction, and a first memory cell coupled to the first selection line and the second selection line. The second memory cell layer is provided above the first memory cell layer, and includes a third selection line extending in the first direction, a fourth selection line extending in the second direction, and a second memory cell coupled to the third selection line and the fourth selection line. The first wiring layer is provided between the first memory cell layer and the second memory cell layer, and includes a first metal wiring line.

In the semiconductor device according to an embodiment of the present disclosure, the first memory cell layer and the second memory cell layer are provided. The first memory cell layer is provided with the first selection line, the second selection line, and the first memory cell. The second memory cell layer is provided with the third selection line, the fourth selection line, and the second memory cell. The first wiring layer including the first metal wiring line is provided between the first memory cell layer and the second memory cell layer.

BRIEF DESCRIPTION OF THE DRAWINGS

FIG. 1 is a block diagram illustrating a configuration example of a semiconductor device according to an embodiment of the present disclosure.

FIG. 2 is an explanatory diagram illustrating a configuration example of a memory unit illustrated in FIG. 1.

FIG. 3 is an explanatory diagram illustrating an example of a layer configuration of a memory unit according to a first embodiment.

FIG. 4 is another explanatory diagram illustrating an example of a layer configuration of the memory unit according to the first embodiment.

FIG. 5 is a circuit diagram illustrating a configuration example of a memory cell illustrated in FIG. 3.

FIG. 6 is a characteristic diagram illustrating a characteristic example of a storage element illustrated in FIG. 5.

FIG. 7 is an explanatory diagram illustrating an example of a layout of a coupling section illustrated in FIG. 3.

FIG. 8 is another explanatory diagram illustrating an example of the layout of the coupling section illustrated in FIG. 7.

FIG. 9 is an explanatory diagram illustrating an example of a layout of a coupling section illustrated in FIG. 4.

FIG. 10 is another explanatory diagram illustrating an example of the layout of the coupling section illustrated in FIG. 9.

FIG. 11 is an explanatory diagram illustrating an example of a layer configuration of a memory unit according to a comparative example.

FIG. 12 is an explanatory diagram illustrating an example of a layer configuration of a memory unit according to a modification example of the first embodiment.

FIG. 13 is an explanatory diagram illustrating an example of a layer configuration of a memory unit according to a second embodiment.

FIG. 14 is another explanatory diagram illustrating an example of the layer configuration of the memory unit according to the second embodiment.

FIG. 15 is an explanatory diagram illustrating an example of a layout of a coupling section illustrated in FIG. 13.

FIG. 16 is an explanatory diagram illustrating an example of a layout of a coupling section illustrated in FIG. 14.

FIG. 17 is another explanatory diagram illustrating an example of the layout of the coupling section illustrated in FIG. 16.

FIG. 18 is an explanatory diagram illustrating an example of a layer configuration of a memory unit according to a modification example of the second embodiment.

MODES FOR CARRYING OUT THE INVENTION

Hereinafter, detailed description is given of embodiments of the present disclosure with reference to the drawings. It is to be noted that the description is given in the following order.

1. First Embodiment (An example of including four storage layers)
2. Second Embodiment (An example of including two storage layers)

1. First Embodiment

[Configuration Example]

FIG. 1 illustrates a configuration example of a semiconductor device (a semiconductor device 1) according to a first embodiment. The semiconductor device 1 includes a memory unit 10 and a peripheral circuit unit 80.

The memory unit 10 is a so-called cross-point memory, and is a non-volatile memory. The memory unit 10 includes a plurality of memory cell arrays 20, a plurality of word line drive sections 30, and a plurality of bit line drive sections 40. The memory cell array 20 includes memory cells arranged in array. As described later, the memory cell array 20 includes a plurality of word lines WL, a plurality of bit lines BL, and a plurality of memory cells MC. Each of the plurality of memory cells MC is coupled to any one of the plurality of word lines WL and to any one of the plurality of bit lines BL. The word line drive section 30 is configured to drive the plurality of word lines WL. The bit line drive section 40 is configured to drive the plurality of bit lines BL.

The peripheral circuit unit 80 includes various circuits related to operations of the memory unit 10. Specifically, the peripheral circuit unit 80 includes, for example, a power supply circuit that generates a selection voltage Vsel and a non-selection voltage Vinh which are described later, a reference voltage generation circuit that generates a reference voltage Vref to be used when performing a reading operation, and the like. It is to be noted that this is not limitative; the peripheral circuit unit 80 may further include, for example, a delay circuit and an oscillating circuit defining an operation speed and an operation timing of the memory unit 10.

It is to be noted that, in this example, the semiconductor device 1 is provided with the memory unit 10 and the peripheral circuit unit 80, but this is not limitative; a logical circuit unit may further be provided, and a logical circuit and a non-volatile memory may be provided in a mixed manner (embedded).

FIG. 2 illustrates a configuration example of the memory unit 10. In the memory unit 10, the plurality of memory cell arrays 20 are arranged side by side in an X-direction and a Y-direction. In the X-direction, the memory cell array 20 and the word line drive section 30 are arranged alternately. In this example, a portion of the memory cell array 20 is arranged to overlap a portion of the word line drive section 30. In the Y-direction, the memory cell array 20 and the bit line drive section 40 are arranged alternately. In this example, the memory cell array 20 and the bit line drive section 40 are arranged not to overlap each other. The memory cell array 20 is provided with the plurality of word lines WL extending in the X-direction and the plurality of bit lines BL extending in the Y-direction.

FIGS. 3 and 4 each illustrate an example of a layer configuration in the memory unit 10. The memory unit 10 includes six wiring layers LM (wiring layers LM1 to LM6) and two memory cell layers LMC (memory cell layers LMC1 and LMC2). In the six wiring layers LM, respective metal wiring lines M1 to M6 are formed. The two memory cell layers LMC configure the memory cell array 20. These layers are formed on a semiconductor substrate 90 in which the word line drive section 30 and the bit line drive section 40 are formed, in the order of the wiring layer LM1, the wiring layer LM2, the wiring layer LM3, the wiring layer LM4, the memory cell layer LMC1, the wiring layer LM5, the memory cell layer LMC2, and the wiring layer LM6, with respective insulating layers interposed therebetween.

In the memory cell layer LMC1, the plurality of word lines WL (word lines WL1), the plurality of memory cells MC (memory cells MC1), the plurality of bit lines BL (bit lines BL1), the plurality of memory cells MC (memory cells MC2), and the plurality of word lines WL (word lines WL2) are formed. The word lines WL1 and WL2 and the bit lines BL1 are each configured using, for example, tungsten (W). As illustrated in FIG. 2, in an XY plane, the word lines WL1 and WL2 are provided to extend in the X-direction and to be aligned in the Y-direction, and the bit lines BL1 are provided to extend in the Y-direction and to be aligned in the X-direction. The plurality of bit lines BL1 are formed in a selection line layer on a selection line layer in which the plurality of word lines WL1 are formed, and the plurality of word lines WL2 are formed in a selection line layer on the selection line layer in which the plurality of bit lines BL1 are formed. This configuration allows the plurality of word lines WL1 and the plurality of bit lines BL1 to intersect each other in the XY plane. The plurality of memory cells MC1 are formed in a storage layer between the selection line layer in which the plurality of word lines WL1 are formed and the selection line layer in which the plurality of bit lines BL1 are formed. Likewise, in the XY plane, the plurality of bit lines BL1 and the plurality of word lines WL2 intersect each other. The plurality of memory cells MC2 are formed in a storage layer between the selection line layer in which the plurality of bit lines BL1 are formed and the selection line layer in which the plurality of word lines WL2 are formed.

In the memory cell layer LMC2, the plurality of word lines WL (word lines WL3), the plurality of memory cells MC (memory cells MC3), the plurality of bit lines BL (bit lines BL2), the plurality of memory cells MC (memory cells MC4), and the plurality of word lines WL (word lines WL4) are formed. The word lines WL3 and WL4 and the bit lines BL2 are each configured using, for example, tungsten (W). As illustrated in FIG. 2, in the XY plane, the word lines WL3 and WL4 are provided to extend in the X-direction and to be aligned in the Y-direction, and the bit lines BL2 are provided to extend in the Y-direction and to be aligned in the X-direction. The plurality of bit lines BL2 are formed in a selection line layer on a selection line layer in which the plurality of word lines WL3 are formed, and the plurality of word lines WL4 are formed in a selection line layer on the selection line layer in which the plurality of bit lines BL2 are formed. This configuration allows the plurality of word lines WL3 and the plurality of bit lines BL2 to intersect each other in the XY plane. The plurality of memory cells MC3 are formed in a storage layer between the selection line layer in which the plurality of word lines WL3 are formed and the selection line layer in which the plurality of bit lines BL2 are formed. Likewise, in the XY plane, the plurality of bit lines BL2 and the plurality of word lines WL4 intersect each other. The plurality of memory cells MC4 are formed in a storage layer between the selection line layer in which the plurality of bit lines BL2 are formed and the selection line layer in which the plurality of word lines WL4 are formed.

FIG. 5 illustrates a configuration example of the memory cell MC. The memory cell MC includes terminals TU and TL, a storage element VR, and a selection element SE.

The terminal TU is coupled to a selection line, of those of the word line WL and the bit line BL, on the storage layer in which the memory cell MC is formed, and the terminal TU is coupled to a selection line, of those of the word line WL and the bit line BL, below the storage layer in which the memory cell MC is formed. In this example, as illustrated in FIGS. 3 and 4, the terminal TU of the memory cell MC1 is coupled to one of the plurality of bit lines BL1, and the terminal TL is coupled to one of the plurality of word lines WL1. The terminal TU of the memory cell MC2 is coupled to one of the plurality of word lines WL2, and the terminal TL is coupled to one of the plurality of bit lines BL1. The terminal TU of the memory cell MC3 is coupled to one of the plurality of bit lines BL2, and the terminal TL is coupled to one of the plurality of word lines WL3. The terminal TU of the memory cell MC4 is coupled to one of the plurality of word lines WL4, and the terminal TL is coupled to one of the plurality of bit lines BL2.

The storage element VR is a resistive random access storage element, and has a resistance state RS that changes reversibly in accordance with a polarity of a voltage difference between voltages applied to both ends. In other words, the resistance state RS of the storage element VR changes reversibly in accordance with a direction of a current flowing between both ends. For the storage element VR, for example, it is possible to use a stack of an ion source layer and a resistance change layer. The storage element VR has one end coupled to the terminal TU of the memory cell MC, and another end coupled to one end of the selection element SE.

FIG. 6 schematically illustrates a distribution of a resistance value of the storage element VR. The storage element VR possibly takes two identifiable resistance states RS (a high resistance state HRS and a low resistance state LRS). In this example, the high resistance state HRS corresponds to data "0", and the low resistance state LRS corresponds to data "1", for example. That is, the storage element VR functions as a storage element that stores one-bit data. For example, causing a change from the high resistance state HRS to the low resistance state LRS is referred to as "set", and causing a change from the low resistance state LRS to the high resistance state HRS is referred to as "reset".

As illustrated in FIGS. 3 and 4, the layer including the storage element VR is formed along a selection line thereon. Specifically, in the memory cell MC1, the layer including the storage element VR is formed along the bit line BL1 as illustrated in FIG. 4. In the memory cell MC2, the layer including the storage element VR is formed along the word line WL2 as illustrated in FIG. 3. In the memory cell MC3, the layer including the storage element VR is formed along the bit line BL2 as illustrated in FIG. 4. In the memory cell MC4, the layer including the storage element VR is formed along the word line WL4 as illustrated in FIG. 3.

The selection element SE (FIG. 5) has bidirectional diode characteristics. Specifically, the selection element SE is brought into an electrically-conductive state (ON state) in a case where an absolute value of the voltage difference between the voltages applied to both ends is larger than a predetermined voltage difference, and is brought into a non-electrically-conductive state (OFF state) in a case where the absolute value of the voltage difference is smaller than the predetermined voltage difference. The selection element SE has the one end coupled to the other end of the storage element VR, and another end coupled to the TL terminal of the memory cell MC.

In a case of setting the memory cell MC, the selection voltage Vsel of 6 V, for example, is applied to the terminal TU, and the selection voltage Vsel of 0 V, for example, is applied to the terminal TL. This brings the selection element SE into an ON state to cause, as illustrated in FIG. 5, a set current Iset to flow from the terminal TU to the terminal TL, thus setting the storage element VR. In a case of resetting the memory cell MC, the selection voltage Vsel of 6 V, for example, is applied to the terminal TL, and the selection voltage Vsel of 0 V, for example, is applied to the terminal TU. This brings the selection element SE into an ON state to cause a reset current Irst to flow from the terminal TL to the terminal TU, thus resetting the storage element VR. In addition, in a case of performing a reading operation on the memory cell MC, the selection voltage Vsel of 5 V, for example, is applied to the terminal TU, and a selection voltage Vsel of 1 V, for example, is applied to the terminal TL. This causes a sense current Isns to flow from the terminal TU to the terminal TL. Then, an unillustrated sense amplifier provided in the word line drive section 30 compares a voltage generated in this memory cell MC with the reference voltage Vref to thereby determine the resistance state RS of the storage element VR.

The word line drive section 30 (FIG. 2) is coupled to the plurality of word lines WL through a coupling section 31. The word line WL in the memory cell array 20 is coupled, in the X-direction, to one of two coupling sections 31 interposing the memory cell array 20.

As illustrated in FIG. 3, the coupling section 31 includes the metal wiring line M4, a via V4, the metal wiring line M5, a via V5, the metal wiring line M6, and vias VWL1 to VWL4. The via V4 couples the metal wiring line M4 and the metal wiring line M5 to each other. The via VWL1 couples the word line WL1 and the metal wiring line M5 to each other. The via VWL2 couples the word line WL2 and the metal wiring line M5 to each other. The via VWL1, the metal wiring line M5, and the via V4 coupled to each other as illustrated on the left side in FIG. 3 are formed integrally using copper (Cu) by means of a so-called dual damascene process. The via VWL1 and the via V4 are formed together with the metal wiring line M5 by means of this dual damascene process, and are formed to couple the metal wiring line M5 to the underlying word line WL1 and metal wiring line M4, respectively; therefore, the via VWL1, and the via V4 are each also referred to as a down-via. Likewise, the via VWL2, the metal wiring line M5, and the via V4 coupled to each other as illustrated on the right side in FIG. 3 are formed integrally using copper (Cu) by means of a so-called dual damascene process. The via V5 couples the metal wiring line M5 and the metal wiring line M6 to each other. The via VWL3 couples the word line WL3 and the metal wiring line M6 to each other. The via VWL4 couples the word line WL4 and the wiring layer M6 to each other. The via VWL3, the metal wiring line M6, and the via V5 coupled to each other as illustrated on the left side in FIG. 3 are formed integrally using copper (Cu) by means of a so-called dual damascene process. Likewise, the via VWL4, the metal wiring line M6, and the via V5 coupled to each other as illustrated on the right side in FIG. 3 are formed integrally using copper (Cu) by means of a so-called dual damascene process.

FIG. 7 illustrates a portion of a layout pattern of the coupling section 31. In the layout pattern of the coupling section 31, patterns PT3 illustrated in FIG. 7 are arranged side by side in the Y-direction. FIG. 7 illustrates patterns of the word lines WL1 and WL2, the metal wiring lines M4 and M5, and the vias V4, VWL1, and VWL2. In this coupling section 31, the pattern of the word line WL3 may be the same as the pattern of the word line WL1, and the pattern of the word line WL4 may be the same as the pattern of the word line WL2. The pattern of the metal wiring line M6 may be the same as the pattern of the metal wiring line M5. The pattern of the via VWL3 may be the same as the pattern of the via VWL1, and the pattern of the via VWL4 may be the same as the pattern of the via VWL2.

FIG. 8 illustrates an example of coupling between the word lines WL and the word line drive section 30 in the coupling section 31. The layout pattern illustrated in this FIG. 8 illustrates a vicinity of the left end of the pattern PT3 illustrated in FIG. 7. The word line WL1 is coupled to the metal wiring line M4 coupled to the word line drive section 30 through the via VWL1, the metal wiring line M5, and the via V4. The word line WL2 is coupled to the metal wiring line M4 coupled to the word line drive section 30 through the via VWL2, the metal wiring line M5, and the via V4. The word line WL3 is coupled to the metal wiring line M4 coupled to the word line drive section 30 through the via VWL3, the metal wiring line M6, the via V5, the metal wiring line M5, and the via V4. The word line WL4 is coupled to the metal wiring line M4 coupled to the word line drive section 30 through the via VWL4, the metal wiring line M6, the via V5, the metal wiring line M5, and the via V4.

The bit line drive section 40 (FIG. 2) is coupled to the plurality of bit lines BL through a coupling section 41. The bit line BL in the memory cell array 20 is coupled, in the Y-direction, to one of two coupling sections 41 interposing the memory cell array 20.

As illustrated in FIG. 4, the coupling section 41 includes the metal wiring line M4, the via V4, the metal wiring line M5, the via V5, the metal wiring line M6, and vias VBL1 and VBL2. The via V4 couples the metal wiring line M4 and the metal wiring line M5 to each other, and the via VBL1 couples the bit line BL1 and the metal wiring line M5 to each other. The via VBL1, the metal wiring line M5, and the via V4 coupled to each other as illustrated on the left side in FIG. 4 are formed integrally using copper (Cu) by means of a so-called dual damascene process. The via V5 couples the metal wiring line M5 and the metal wiring line M6 to each other, and the via VBL2 couples the bit line BL2 and the metal wiring line M6 to each other. The via VBL2, the metal wiring line M6, and the via V5 coupled to each other as illustrated on the right side in FIG. 4 are formed integrally using copper (Cu) by means of a so-called dual damascene process.

FIG. 9 illustrates a portion of a layout pattern of the coupling section 41. In the layout pattern of the coupling section 41, patterns PT4 illustrated in FIG. 9 are arranged side by side in the X-direction. FIG. 9 illustrates patterns of the bit lines BL1 and BL2, the metal wiring lines M5 and M6, and the vias V4, V5, VBL1, and VBL2. In this coupling section 41, the pattern of the bit line BL2 may be the same as the pattern of the bit line BL1. The pattern of the via VBL2 may be the same as the pattern of the via VBL1.

FIG. 10 illustrates an example of coupling between the bit lines BL and the bit line drive section 40 in the coupling section 41. The bit line BL1 is coupled to the metal wiring line M4 (unillustrated) coupled to the bit line drive section 40 through the via VBL1, the metal wiring line M5, and the via V4. The bit line BL2 is coupled to the metal wiring line M4 (unillustrated) coupled to the bit line drive section 40 through the via VBL2, the metal wiring line M6, the via V5, the metal wiring line M5, and the via V4.

In this example, as illustrated in FIG. 3, the word line WL1 is coupled to the word line WL3 through the via VWL1, the metal wiring line M5, the via V5, the metal wiring line M6, and the via VWL3. This allows the word lines WL1 and WL3 to be driven collectively by the word line drive section 30. Meanwhile, as illustrated in FIG. 4, the bit line BL1 is not coupled to the bit line BL2. This allows the bit lines BL1 and BL2 to be driven individually by the bit line drive section 40. In this manner, the word lines WL1 and WL3 are coupled to each other, whereas the bit lines BL1 and BL2 are driven individually, thus enabling the memory cells MC1 and MC3 to be driven individually.

Likewise, as illustrated in FIG. 3, the word line WL2 is coupled to the word line WL4 through the via VWL2, the metal wiring line M5, the via V5, the metal wiring line M6, and the via VWL4. This allows the word lines WL2 and WL4 to be driven collectively by the word line drive section 30. Meanwhile, as illustrated in FIG. 4, the bit line BL2 is not coupled to the bit line BL1. This allows the bit lines BL1 and BL2 to be driven individually by the bit line drive section 40. In this manner, the word lines WL2 and WL4 are coupled to each other, whereas the bit lines BL1 and BL3 are driven individually, thus enabling the memory cells MC2 and MC4 to be driven individually.

Here, the memory cell layer LMC1 corresponds to a specific example of a "first memory cell layer" in the present disclosure. The word line WL1 corresponds to a specific example of a "first selection line" in the present disclosure. The bit line BL1 corresponds to a specific example of a "second selection line" in the present disclosure. The memory cell layer LMC2 corresponds to a specific example of a "second memory cell layer" in the present disclosure. The word line WL3 corresponds to a specific example of a "third selection line" in the present disclosure. The bit line BL2 corresponds to a specific example of a "fourth selection line" in the present disclosure. The wiring layer LM5 corresponds to a specific example of a "first wiring layer" in the present disclosure. The wiring layer LM4 corresponds to a specific example of a "second wiring layer" in the present disclosure. The wiring layer LM6 corresponds to a specific example of a "third wiring layer" in the present disclosure. The via VWL1 corresponds to a specific example of a "first via" in the present disclosure. The via VWL3 corresponds to a specific example of a "third via" in the present disclosure. The word line drive section 30 corresponds to a specific example of a "drive circuit" in the present disclosure. The via VBL1 corresponds to a specific example of a "fifth via" in the present disclosure. The via VBL2 corresponds to a specific example of a "sixth via" in the present disclosure.

[Operation and Workings]

Subsequently, description is given of the operation and workings of the semiconductor device 1 of the present embodiment.

(Overview of Overall Operation)

First, description is given of an overview of an overall operation of the semiconductor device 1 with reference to FIGS. 1 and 2. The memory unit 10 stores information. In the memory unit 10, the memory cell MC provided in the memory cell array 20 stores information. The word line drive section 30 drives the plurality of word lines WL provided in the memory cell array 20. The bit line drive section 40 drives the plurality of bit lines BL provided in the memory cell array 20. The word line drive section 30 and the bit line drive section 40 apply the selection voltage Vsel of 6 V, for example, to the terminal TU of the memory cell MC and apply the selection voltage Vsel of 0 V, for example, to the terminal TL to thereby set the memory cell MC. In addition, the word line drive section 30 and the bit line drive section 40 apply the selection voltage Vsel of 6 V, for example, to the terminal TL of the memory cell MC and apply the selection voltage Vsel of 0 V, for example, to the terminal TU to thereby reset the memory cell MC. In addition, the word line drive section 30 and the bit line drive section 40 apply the selection voltage Vsel of 5 V, for example, to the terminal TU of the memory cell MC and apply the selection voltage Vsel of 1 V, for example, to the terminal TL to thereby read information from the memory cell MC.

(Effects)

The semiconductor device 1 is provided with the memory cell layer LMC1, the wiring layer M5, and the memory cell layer LMC2. The memory cell layer LMC1 is provided with the word line WL extending in the X-direction, the bit line BL extending in the Y-direction, and the memory cell MC coupled to the word line WL and the bit line BL. In addition, the memory cell layer LMC2 is provided with the word line WL extending in the X-direction, the bit line BL extending in the Y-direction, and the memory cell MC coupled to the word line WL and the bit line BL. In addition, the wiring layer M5 is provided between the two memory cell layers LMC1 and LMC2. This makes it easier to manufacture the semiconductor device 1.

That is, for example, in a case where no wiring layer is provided between the two memory cell layers, four storage layers are provided in one memory cell layer LMC, as in a memory unit 10R illustrated in FIG. 11. This may possibly make it difficult to manufacture a semiconductor device. Specifically, the number of layers included in this memory cell layer LMC is increased, thus possibly making it difficult to manufacture the semiconductor device. In addition, for example, the memory cell layer LMC is thick, and thus the heights of the vias V4 and VWL1 are increased, which therefore results in high aspect ratios of these vias. As a result, for example, yield may possibly be decreased. In addition, the via V4 having a high aspect ratio and the via VWL3 having a low aspect ratio are formed in the same dual damascene process, and thus a large difference in the aspect ratios may possibly cause yield to be decreased, for example. As a result, it may possibly be difficult to manufacture the semiconductor device.

Meanwhile, in the semiconductor device 1, the wiring layer M5 is provided between the memory cell layer LMC1 and the memory cell layer LMC2. This enables the memory cell layer LMC1 to be provided with two storage layers of the four storage layers and the memory cell layer LMC2 to be provided with the remaining two storage layers. That is, the number of layers included in each of the memory cell layers LMC1 and LMC2 is able to be reduced, thus making it easier to manufacture the semiconductor device 1. In addition, as illustrated in FIGS. 3 and 4, it is possible to thin the memory cell layers LMC1 and LMC2, which therefore enables the heights of the vias V4 and V5 to be lowered, thus making it possible to suppress a reduction in the yield. In addition, it is possible to reduce the difference between the aspect ratio of the via V4 and the aspect ratio of the via VWL2, and to reduce the difference between the aspect ratio of the via V5 and the aspect ratio of the via VWL4, thus making it possible to suppress a reduction in the yield. This consequently makes it easier to manufacture the semiconductor device 1.

In addition, in the semiconductor device 1, for example, the wiring layer M5 and the via VWL1 are formed using a dual damascene process. That is, the wiring layer M5 and the via VWL1 are configured integrally using the same material. This makes it easier to manufacture the semiconductor device 1. That is, for example, in a case where the metal wiring line M4 and the word line WL1 are directly coupled to each other by a via, this via is not able to be formed by a commonly used dual damascene process. In this case, for example, a via is formed on the metal wiring line M4, and the word line WL1 is formed on that via. The via thus formed is also referred to as an up-via. In this case, a less common manufacturing process needs to be used for the formation of this via, which may possibly be costly and may possibly reduce the yield, thus making the manufacture difficult. Meanwhile, in the semiconductor device 1, the commonly used dual damascene process is used for the manufacture of these vias, thus making it possible to reduce the cost as well as the possibility of a reduction in the yield. The description has been given above by exemplifying the wiring layer M5 and the via VWL1; however, the same holds true also for the wiring layer M5 and the via VWL2, the wiring layer M6 and the via VWL3, the wiring layer M6 and the via VWL4, the wiring layer M5 and the via VBL1, and the wiring layer M6 and the via VBL2. This consequently makes it easier to manufacture the semiconductor device 1.

In addition, it is possible, in the semiconductor device 1, to allow the respective layouts of the word line WL1, the memory cell MC1, the bit line BL1, the memory cell MC2, the word line WL2, and the vias VWL1, VWL2 and VBL1 in the memory cell layer LMC1, and the respective layouts of the word line WL3, the memory cell MC3, the bit line BL2, the memory cell MC4, the word line WL4, and the vias VWL3, VWL4 and VBL2 in the memory cell layer LMC2 to be the same. This enables a reduction in the number of masks to be used in the semiconductor manufacturing steps, thus making it possible to reduce the manufacturing costs. This consequently makes it easier to manufacture the semiconductor device 1.

[Effects]

As described above, in the present embodiment, the wiring layer is provided between the two memory cell layers, thus making it easier to manufacture the semiconductor device.

In the present embodiment, for example, the wiring layer and the via are configured integrally by the same material using the dual damascene process, thus making it easier to manufacture the semiconductor device.

In the present embodiment, it is possible to reduce the number of masks, thus making it easier to manufacture the semiconductor device.

Modification Example 1-1

In the foregoing embodiment, as illustrated in FIGS. 3 and 8, the word line WL1 and the word line WL3 are coupled to each other, and the word line WL2 and the word line WL4 are coupled to each other, in the coupling section 31, but this is not limitative. Alternatively, for example, as in a memory unit 10A illustrated in FIG. 12, the word line WL1 and the word line WL3 may not be coupled to each other, and the word lines WL2 and WL4 may not be coupled to each other, in a coupling section 31A.

2. Second Embodiment

Next, description is given of a semiconductor device 2 according to a second embodiment. In the present embodiment, the number of the storage layers of the memory cells MC in the memory cell layers LMC1 and LMC2 is changed. It is to be noted that components substantially the same as those of the semiconductor device 1 according to the foregoing first embodiment are denoted by the same reference numerals, and descriptions thereof are omitted as appropriate.

The semiconductor device 2 includes a memory unit 110 and the peripheral circuit unit 80, similarly to the semiconductor device 1 (FIG. 1) according to the foregoing first embodiment. Similarly to the memory unit 10 (FIGS. 1 and 2) according to the foregoing first embodiment, the memory unit 110 includes a plurality of memory cell arrays 120, a plurality of word line drive sections 130, and a plurality of bit line drive sections 140. The arrangement of the plurality of memory cell arrays 120, the plurality of word line drive sections 130, and the plurality of bit line drive sections 140 is similar to the arrangement (FIG. 2) of the plurality of memory cell arrays 20, the plurality of word line drive sections 30, and the plurality of bit line drive sections 40 according to the foregoing first embodiment.

FIGS. 13 and 14 each illustrate an example of a layer configuration in the memory unit 110.

In the memory cell layer LMC1, the plurality of word lines WL (word lines WL1), the plurality of memory cells MC (memory cells MC1), and the plurality of bit lines BL (bit lines BL1) are formed. As illustrated in FIG. 2, in the XY plane, the word lines WL1 are provided to extend in the X-direction and to be aligned in the Y-direction, and the bit lines BL1 are provided to extend in the Y-direction and to be aligned in the X-direction. The plurality of bit lines BL1 are formed in a selection line layer on a selection line layer in which the plurality of word lines WL1 are formed. This configuration allows the plurality of word lines WL1 and the plurality of bit lines BL1 to intersect each other in the XY plane. The plurality of memory cells MC1 are formed in a storage layer between the selection line layer in which the plurality of word lines WL1 are formed and the selection line layer in which the plurality of bit lines BL1 are formed.

In the memory cell layer LMC2, the plurality of word lines WL (word lines WL2), the plurality of memory cells MC (memory cells MC2), and the plurality of bit lines BL (bit lines BL2) are formed. As illustrated in FIG. 2, in the XY plane, the word lines WL2 are provided to extend in the X-direction and to be aligned in the Y-direction, and the bit lines BL2 are provided to extend in the Y-direction and to be aligned in the X-direction. The plurality of bit lines BL2 are formed in a selection line layer on a selection line layer in which the plurality of word lines WL2 are formed. This configuration allows the plurality of word lines WL2 and the plurality of bit lines BL2 to intersect each other in the XY plane. The plurality of memory cells MC2 are formed in a storage layer between the selection line layer in which the plurality of word lines WL2 are formed and the selection line layer in which the plurality of bit lines BL2 are formed.

Similarly to the case of the foregoing first embodiment (FIG. 2), the word line drive section 130 is coupled to the plurality of word lines WL through a coupling section 131. As illustrated in FIG. 13, the coupling section 131 includes the metal wiring line M4, the via V4, the metal wiring line M5, the via V5, the metal wiring line M6, and the vias VWL1 and VWL2. The via VWL1, the metal wiring line M5, and the via V4 coupled to each other are formed integrally using copper (Cu) by means of a so-called dual damascene process. Likewise, the via VWL2, the metal wiring line M6, and the via V5 coupled to each other are formed integrally using copper (Cu) by means of a so-called dual damascene process.

FIG. 15 illustrates a portion of a layout pattern of the coupling section 131. In the layout pattern of the coupling section 31, patterns PT13 illustrated in FIG. 15 are arranged side by side in the Y-direction. FIG. 15 illustrates patterns of the word lines WL1 and WL2, the metal wiring lines M4 and M5, and the vias V4, V5, VWL1, and VWL2. In this coupling section 131, the pattern of the word line WL2 may be the same as the pattern of the word line WL1, and the pattern of the via VWL2 may be the same as the pattern of the via VWL1.

The word line WL1 is coupled to the metal wiring line M4 coupled to the word line drive section 130 through the via VWL1, the metal wiring line M5, and the via V4. The word line WL2 is coupled to the metal wiring line M4 coupled to the word line drive section 130 through the via VWL2, the metal wiring line M6, the via V5, the metal wiring line M5, and the via V4.

Similarly to the case of the foregoing first embodiment (FIG. 2), the bit line drive section 140 is coupled to the plurality of bit lines BL through a coupling section 141. As illustrated in FIG. 14, the coupling section 141 includes the metal wiring line M4, the via V4, the metal wiring line M5, the via V5, the metal wiring line M6, and the vias VBL1 and VBL2. The via VBL1, the metal wiring line M5, and the via V4 coupled to each other are formed integrally using copper (Cu) by means of a so-called dual damascene process. Likewise, the via VBL2, the metal wiring line M6, and the via V5 coupled to each other are formed integrally using copper (Cu) by means of a so-called dual damascene process.

FIG. 16 illustrates a portion of a layout pattern of the coupling section 141. In the layout pattern of the coupling section 141, patterns PT14 illustrated in FIG. 16 are arranged side by side in the X-direction. FIG. 16 illustrates patterns of the bit line BL1, the metal wiring lines M4 and M5, and the vias V4 and VBL1. In this coupling section 141, the pattern of the bit line BL2 may be the same as the pattern of the bit line BL1. The pattern of the metal wiring line M6 may be the same as the pattern of the metal wiring line M5. The pattern of the via V5 may be the same as the pattern of the via V4, and the pattern of the via VBL2 may be the same as the pattern of the via VBL1.

FIG. 17 illustrates an example of coupling between the bit lines BL and the bit line drive section 140 in the coupling section 141. The bit line BL1 is coupled to the metal wiring line M4 coupled to the bit line drive section 140 through the via VBL1, the metal wiring line M5, and the via V4. The bit line BL2 is coupled to the metal wiring line M4 coupled to the bit line drive section 140 through the via VBL2, the metal wiring line M6, the via V5, the metal wiring line M5, and the via V4.

In this example, as illustrated in FIG. 14, the bit line BL1 is coupled to the bit line BL2 through the via VBL1, the metal wiring line M5, the via V5, the metal wiring line M6, and the via VBL2. This allows the bit lines BL1 and BL2 to be driven collectively by the bit line drive section 140. Meanwhile, as illustrated in FIG. 13, the word line WL1 is not coupled to the word line WL2. This allows the word lines WL1 and WL2 to be driven individually by the word line drive section 130. In this manner, the bit lines BL1 and BL2 are coupled to each other, whereas the word lines WL1 and WL2 are driven individually, thus enabling the memory cells MC1 and MC2 to be driven individually.

In the semiconductor device 2, the memory cell layer LMC1 is provided with one storage layer, and the memory cell layer LMC2 is provided with one storage layer; the wiring layer M5 is provided between the two memory cell layers LMC1 and LMC2. Also in this case, it is possible to facilitate the manufacture of the semiconductor device 1 as compared with a case where one memory cell layer LMC is provided with two storage layers.

In addition, in the semiconductor device 2, similarly to the semiconductor device 1 according to the foregoing first embodiment, the wiring layer and the via are configured integrally by the same material using the dual damascene process, thus making it easier to manufacture the semiconductor device 1.

In addition, it is possible, in the semiconductor device 2, to allow the respective layouts of the word line WL1, the memory cell MC1, the bit line BL1, and the vias VWL1 and VBL1 in the memory cell layer LMC1, and the respective layouts of the word line WL2, the memory cell MC2, the bit line BL2, and the vias VWL2 and VBL2 in the memory cell layer LMC2 to be the same. This enables a reduction in the number of masks to be used in the semiconductor manufacturing steps, thus making it possible to reduce the manufacturing costs. This consequently makes it easier to manufacture the semiconductor device 2.

As described above, in the present embodiment, the wiring layer is provided between the two memory cell layers, thus making it easier to manufacture the semiconductor device.

In the present embodiment, for example, the wiring layer and the via are configured integrally by the same material using the dual damascene process, thus making it easier to manufacture the semiconductor device.

In the present embodiment, it is possible to reduce the number of masks, thus making it easier to manufacture the semiconductor device.

Modification Example 2-1

In the foregoing embodiment, as illustrated in FIGS. 14 and 17, the bit line BL1 and the bit line BL2 are coupled to each other in the coupling section 141, but this is not limitative. Alternatively, for example, as in a memory unit 110A illustrated in FIG. 18, the bit line BL1 and the bit line BL2 may not be coupled to each other in a coupling section 141A.

Although the description has been given above of the present technology referring to some embodiments and modification examples, the present technology is not limited to these embodiments and the like, and may be modified in a wide variety of ways.

For example, in each of the foregoing embodiments and the like, the two memory cell layers LMC are provided, but this is not limitative. Alternatively, for example, three or more memory cell layers LMC may be provided. A wiring layer is desirably provided between these memory cell layers LMC.

It is to be noted that the effects described herein are merely illustrative and non-limiting, and other effects may be included.

It is to be noted that the present technology may have the following configurations. According to the technology of the following configurations, it is possible to facilitate the manufacture of the semiconductor device.

(1)

A semiconductor device including:

a first memory cell layer including a first selection line extending in a first direction, a second selection line extending in a second direction, and a first memory cell coupled to the first selection line and the second selection line;

a second memory cell layer provided above the first memory cell layer, and including a third selection line extending in the first direction, a fourth selection line extending in the second direction, and a second memory cell coupled to the third selection line and the fourth selection line; and a first wiring layer provided between the first memory cell layer and the second memory cell layer and including a first metal wiring line.

(2)

The semiconductor device according to (1), further including a first via provided below the first wiring layer and configured integrally with the first metal wiring line, the first via coupling the first metal wiring line and the first selection line of the first memory cell layer to each other.

(3)

The semiconductor device according to (1) or (2), further including the first via provided below the first wiring layer and configured by same material as the first metal wiring line, the first via coupling the first metal wiring line and the first selection line of the first memory cell layer to each other.

(4)

The semiconductor device according to (2) or (3), further including:

a second wiring layer including a second metal wiring line provided below the first memory cell layer;

a second via provided between the first wiring layer and the second wiring layer and configured integrally with the first metal wiring line, the second via coupling the first metal wiring line and the second metal wiring line to each other; and a drive circuit provided below the second wiring layer and being coupled to the second metal wiring line, the drive circuit driving the first selection line of the first memory cell layer.

(5)

The semiconductor device according to any one of (2) to (4), further including:

a third wiring layer including a third metal wiring line provided above the second memory cell layer; and a third via provided between the third wiring layer and the first wiring layer and configured integrally with the third metal wiring line, the third via coupling the third metal wiring line and the third selection line of the second memory cell layer to each other.

(6)

The semiconductor device according to (5), further including a fourth via provided between the third wiring layer and the first wiring layer and configured integrally with the third metal wiring line, the fourth via coupling the third metal wiring line and the first metal wiring line to each other.

(7)

The semiconductor device according to (5), further including:

a fourth via provided between the third wiring layer and the first wiring layer; and a drive circuit provided below the first memory cell layer and driving the third selection line of the second memory cell layer, in which the first wiring layer includes a fourth metal wiring line coupled to the drive circuit, and the fourth via is configured integrally with the third metal wiring line and couples the third metal wiring line and the fourth metal wiring line to each other.

(8)

The semiconductor device according to any one of (5) to (7), in which the third via provided between the third wiring layer and the first wiring layer and the first via provided below the first wiring layer are arranged at same position in a plane including the first direction and the second direction.

(9)

The semiconductor device according to (8), further including:

a fifth via provided below the first wiring layer; and a sixth via provided between the third wiring layer and the first wiring layer, in which the first wiring layer includes a fifth metal wiring line, the third wiring layer includes a sixth metal wiring line, the fifth via is configured integrally with the fifth metal wiring line and couples the fifth metal wiring line and the second selection line to each other, the sixth via is configured integrally with the sixth metal wiring line and couples the sixth metal wiring line and the fourth selection line to each other, and the fifth via and the sixth via are arranged at same position in the plane including the first direction and the second direction.

(10)

The semiconductor device according to any one of (1) to (9), in which the first selection line in the first memory cell layer and the third selection line in the second memory cell layer are arranged at same position in the plane including the first direction and the second direction, and the second selection line in the first memory cell layer and the fourth selection line in the second memory cell layer are arranged at same position in the plane including the first direction and the second direction.

(11)

The semiconductor device according to any one of (1) to (10), in which the first memory cell layer further includes a fifth wiring line extending in the first direction and a third memory cell coupled to the second selection line and the fifth wiring line, and the second memory cell layer further includes a sixth wiring line extending in the first direction and a fourth memory cell coupled to the fourth selection line and the sixth wiring line.

This application claims the priority on the basis of Japanese Patent Application No. 2020-187190 filed with the Japan Patent Office on Nov. 10, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:

a first memory cell layer including a first selection line extending in a first direction, a second selection line extending in a second direction, and a first memory cell coupled to the first selection line and the second selection line;

a second memory cell layer provided above the first memory cell layer, and including a third selection line extending in the first direction, a fourth selection line extending in the second direction, and a second memory cell coupled to the third selection line and the fourth selection line;

a first wiring layer provided between the first memory cell layer and the second memory cell layer and including a first metal wiring line; and a first via provided below the first wiring layer and configured by same material as the first metal wiring line, the first via coupling the first metal wiring line and the first selection line of the first memory cell layer to each other.

2. The semiconductor device according to claim 1, wherein the first selection line in the first memory cell layer and the third selection line in the second memory cell layer are arranged at same position in a plane including the first direction and the second direction, and the second selection line in the first memory cell layer and the fourth selection line in the second memory cell layer are arranged at same position in the plane including the first direction and the second direction.

3. A semiconductor device comprising:

a first memory cell layer including a first selection line extending in a first direction, a second selection line extending in a second direction, and a first memory cell coupled to the first selection line and the second selection line;

a second memory cell layer provided above the first memory cell layer, and including a third selection line extending in the first direction, a fourth selection line extending in the second direction, and a second memory cell coupled to the third selection line and the fourth selection line;

a first wiring layer provided between the first memory cell layer and the second memory cell layer and including a first metal wiring line;

a first via provided below the first wiring layer and configured integrally with the first metal wiring line, the first via coupling the first metal wiring line and the first selection line of the first memory cell layer to each other;

a second wiring layer including a second metal wiring line provided below the first memory cell layer;

a second via provided between the first wiring layer and the second wiring layer and configured integrally with the first metal wiring line, the second via coupling the first metal wiring line and the second metal wiring line to each other; and a drive circuit provided below the second wiring layer and being coupled to the second metal wiring line, the drive circuit driving the first selection line of the first memory cell layer.

4. A semiconductor device comprising:

a first memory cell layer including a first selection line extending in a first direction, a second selection line extending in a second direction, and a first memory cell coupled to the first selection line and the second selection line;

a second memory cell layer provided above the first memory cell layer, and including a third selection line extending in the first direction, a fourth selection line extending in the second direction, and a second memory cell coupled to the third selection line and the fourth selection line;

a first wiring layer provided between the first memory cell layer and the second memory cell layer and including a first metal wiring line;

a first via provided below the first wiring layer and configured integrally with the first metal wiring line, the first via coupling the first metal wiring line and the first selection line of the first memory cell layer to each other;

a second wiring layer including a second metal wiring line provided above the second memory cell layer; and a second via provided between the second wiring layer and the first wiring layer and configured integrally with the second metal wiring line, the second via coupling the second metal wiring line and the third selection line of the second memory cell layer to each other.

5. The semiconductor device according to claim 4, further comprising a third via provided between the second wiring layer and the first wiring layer and configured integrally with the second metal wiring line, the third via coupling the second metal wiring line and the first metal wiring line to each other.

6. The semiconductor device according to claim 4, further comprising:

a third via provided between the second wiring layer and the first wiring layer; and a drive circuit provided below the first memory cell layer and driving the third selection line of the second memory cell layer, wherein the first wiring layer includes a third metal wiring line coupled to the drive circuit, and the third via is configured integrally with the second metal wiring line and couples the second metal wiring line and the third metal wiring line to each other.

7. The semiconductor device according to claim 4, wherein the second via provided between the second wiring layer and the first wiring layer and the first via provided below the first wiring layer are arranged at same position in a plane including the first direction and the second direction.

8. The semiconductor device according to claim 7, further comprising:

a third via provided below the first wiring layer; and a fourth via provided between the second wiring layer and the first wiring layer, wherein the first wiring layer includes a third metal wiring line, the second wiring layer includes a fourth metal wiring line, the third via is configured integrally with the third metal wiring line and couples the third metal wiring line and the second selection line to each other, the fourth via is configured integrally with the fourth metal wiring line and couples the fourth metal wiring line and the fourth selection line to each other, and the third via and the fourth via are arranged at same position in the plane including the first direction and the second direction.

9. A semiconductor device comprising:

a first memory cell layer including a first selection line extending in a first direction, a second selection line extending in a second direction, and a first memory cell coupled to the first selection line and the second selection line;

a second memory cell layer provided above the first memory cell layer, and including a third selection line extending in the first direction, a fourth selection line extending in the second direction, and a second memory cell coupled to the third selection line and the fourth selection line; and a first wiring layer provided between the first memory cell layer and the second memory cell layer and including a first metal wiring line, wherein the first memory cell layer further includes a second metal wiring line extending in the first direction and a third memory cell coupled to the second selection line and the second metal wiring line, and the second memory cell layer further includes a third metal wiring line extending in the first direction and a fourth memory cell coupled to the fourth selection line and the third metal wiring line.

* * * * *